US009287034B2

(12) United States Patent
Mano et al.

(10) Patent No.: US 9,287,034 B2
(45) Date of Patent: Mar. 15, 2016

(54) PRINTED WIRING BOARD, INDUCTOR COMPONENT, AND METHOD FOR MANUFACTURING INDUCTOR COMPONENT

(71) Applicant: IBIDEN CO., LTD., Ogaki-shi (JP)

(72) Inventors: Yasuhiko Mano, Ogaki (JP); Kazuhiro Yoshikawa, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 322 days.

(21) Appl. No.: 13/729,106

(22) Filed: Dec. 28, 2012

(65) Prior Publication Data

US 2013/0223033 A1   Aug. 29, 2013

Related U.S. Application Data

(60) Provisional application No. 61/603,575, filed on Feb. 27, 2012.

(51) Int. Cl.
*H05K 1/18* (2006.01)
*H01F 27/28* (2006.01)
(Continued)

(52) U.S. Cl.
CPC ........ *H01F 27/2804* (2013.01); *H01F 17/0013* (2013.01); *H05K 1/165* (2013.01); *H05K 1/18* (2013.01); *H05K 1/185* (2013.01); *H01F 2017/002* (2013.01); *H01F 2017/0066* (2013.01); *H05K 1/162* (2013.01); *H05K 3/4602* (2013.01); *H05K 3/4682* (2013.01);
(Continued)

(58) Field of Classification Search
CPC ....... H05K 1/168; H05K 1/185; H05K 1/162; H05K 1/165; H05K 1/183; H05K 2201/083; H05K 2201/086; H05K 1/18; H05K 3/46; H05K 3/4682
USPC .................. 361/301.3, 761, 763; 174/260
See application file for complete search history.

(56) References Cited

U.S. PATENT DOCUMENTS 6,996,892 B1 * 2/2006 Dening et al. ............... 29/602.1
2002/0185303 A1 12/2002 Takeuchi et al.
(Continued)

FOREIGN PATENT DOCUMENTS

| CN | 1855124 B | 9/2010 |
|----|-----------|--------|
| JP | 2002-158450 | 5/2002 |
| JP | 2005-220248 | 8/2005 |
| JP | 2005-222984 | 8/2005 |

*Primary Examiner* — Hoa C Nguyen
*Assistant Examiner* — Christopher L Augustin
(74) *Attorney, Agent, or Firm* — Oblon, McClelland, Maier & Neustadt, L.L.P.

(57) ABSTRACT

A printed wiring board has a core base having an opening portion, an inductor component accommodated in the opening portion, and a filler resin filling gap between the component and a side wall of the opening portion. The component has a support layer, a first conductive pattern on the support, an interlayer insulation layer on the support and first pattern, a second conductive pattern on the insulation layer, and a via conductor in the insulation layer and connecting the first and second patterns, the insulation layer includes a magnetic layer and a resin layer covering the magnetic layer, the magnetic layer includes magnetic material and resin material and has a first hole, the insulation layer has a second hole penetrating through the resin layer such that the second hole passes through the first hole and extends to the first pattern, and the via conductor is formed in the second hole.

20 Claims, 23 Drawing Sheets

(51) Int. Cl.
*H01F 17/00* (2006.01)
*H05K 1/16* (2006.01)
*H05K 3/46* (2006.01)

(52) U.S. Cl.
CPC .. *H05K2201/086* (2013.01); *H05K 2201/1003* (2013.01); *H05K 2203/0191* (2013.01); *H05K 2203/1469* (2013.01)

(56) References Cited

U.S. PATENT DOCUMENTS

| | | | |
|---|---|---|---|
| 2003/0071326 A1* | 4/2003 | Lin | 257/531 |
| 2012/0212919 A1 | 8/2012 | Mano et al. | |
| 2014/0034373 A1* | 2/2014 | Yoshikawa et al. | 174/260 |

* cited by examiner

FIG. 9
(A)
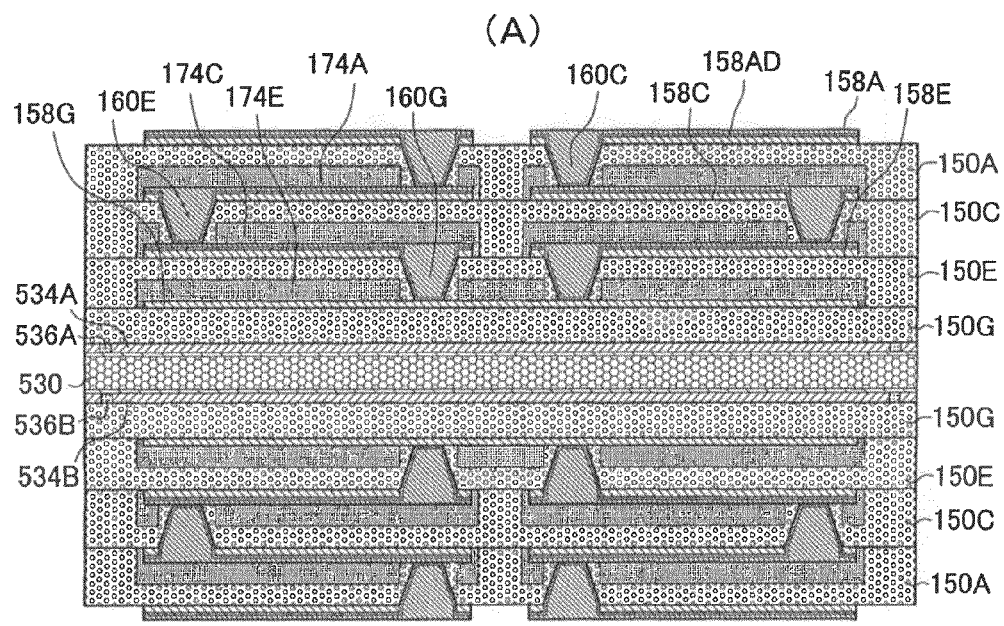
(B)
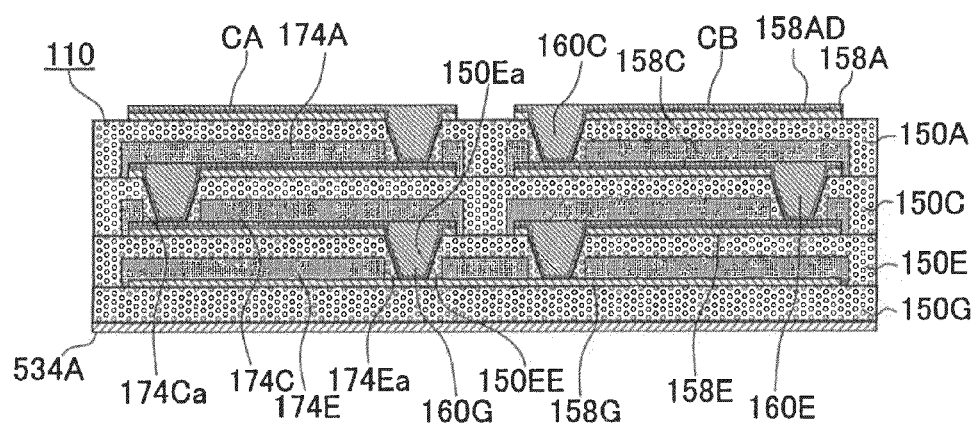

FIG. 10
(A)
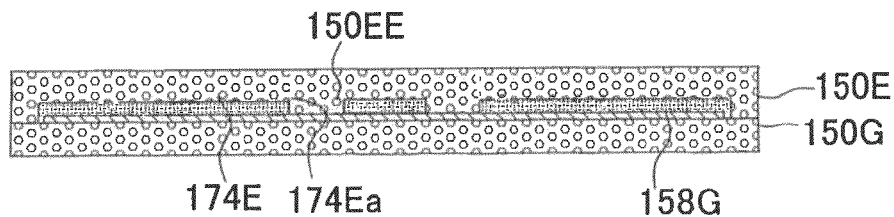
(B)
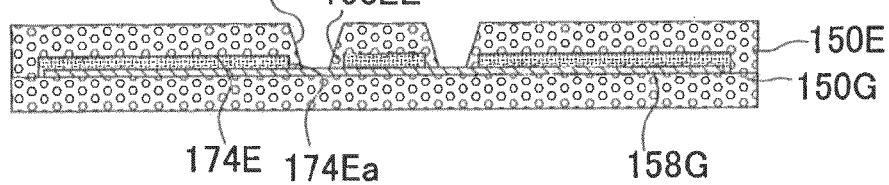
(C)
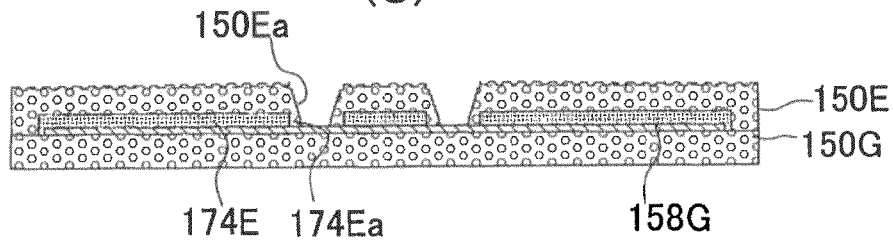
(D)
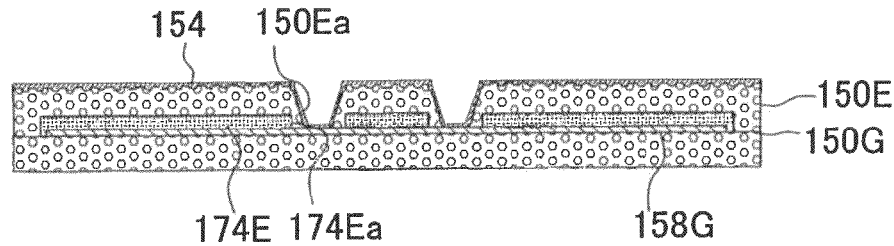
(E)
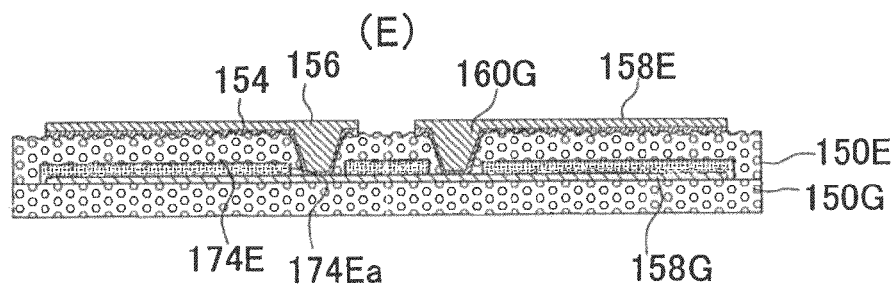

FIG. 12
(A)
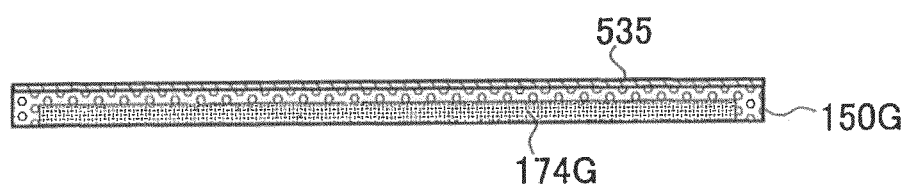
(B)
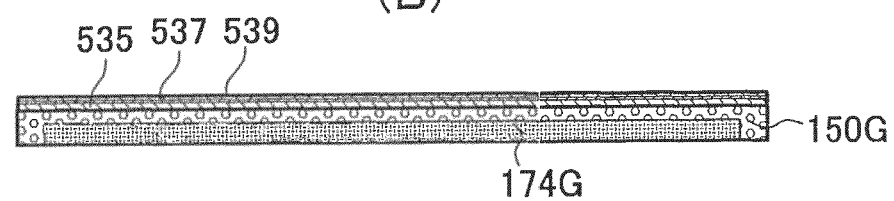
(C)
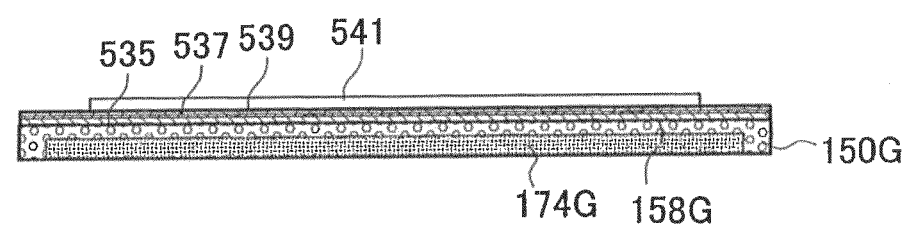

FIG. 13
(A)
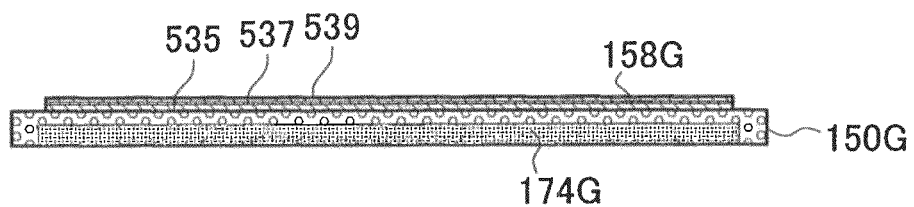
(B)
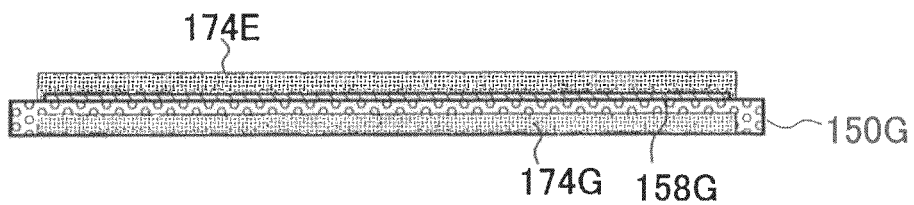
(C)
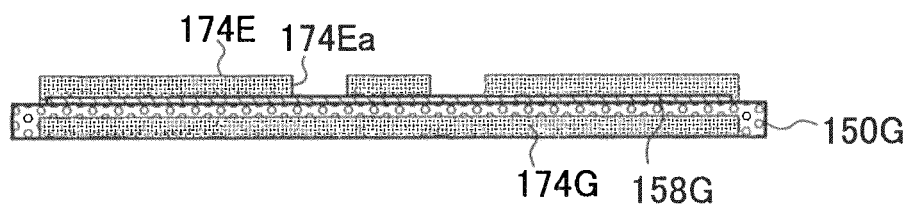
(D)
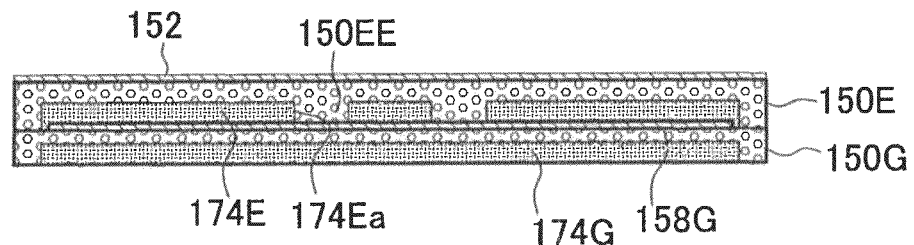
(E)
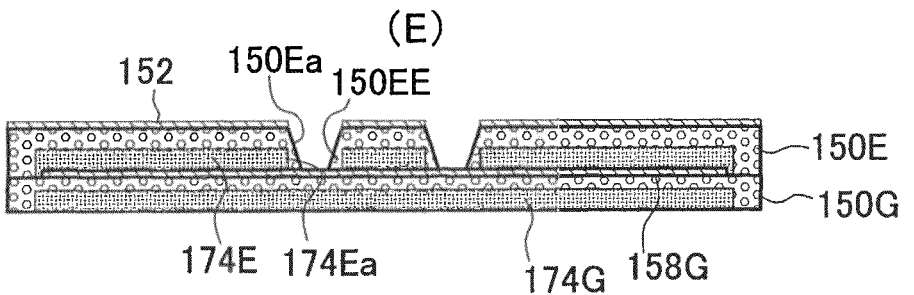

FIG. 23 (A)
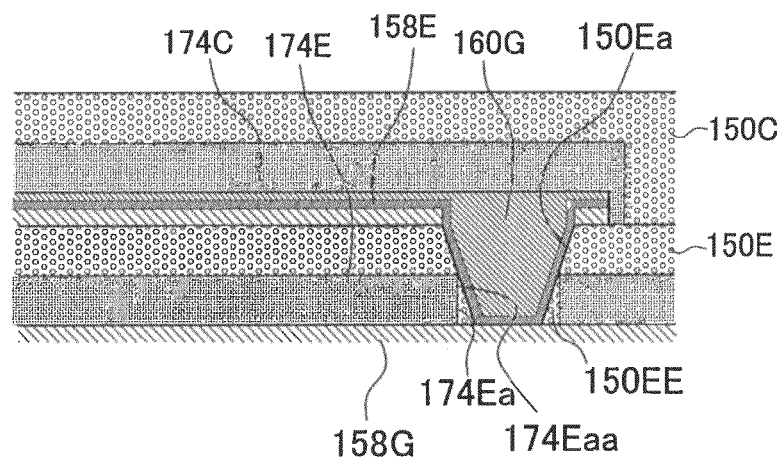
(B)
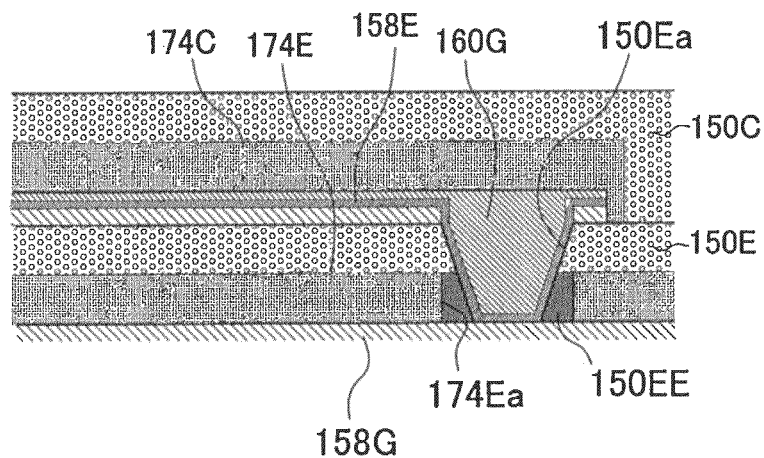

PRINTED WIRING BOARD, INDUCTOR COMPONENT, AND METHOD FOR MANUFACTURING INDUCTOR COMPONENT

CROSS-REFERENCE TO RELATED APPLICATIONS

The present application is based upon and claims the benefit of priority from U.S. application Ser. No. 61/603,575, filed Feb. 27, 2012, the entire contents of which are incorporated herein by reference.

BACKGROUND OF THE INVENTION

1. Field of the Invention

The present invention relates to a printed wiring board including a core material, buildup layers formed on both surfaces of the core material with interlayer resin layers and conductive patterns on the interlayer resin layers, and an inductor component accommodated in the core material. The present invention also relates to a method for manufacturing such a printed wiring board.

2. Description of Background Art

Japanese Laid-Open Patent Publication No. 2002-158450 describes a printed wiring board where an inductor component is accommodated in a core material. The entire contents of this publication are incorporated herein by reference.

SUMMARY OF THE INVENTION

According to one aspect of the present invention, a printed wiring board includes a core base having an opening portion, an inductor component accommodated in the opening portion of the core base, and a filler resin filling a gap formed between the inductor component and a side wall of the opening portion of the core base. The inductor component has a support layer, a first conductive pattern formed on the support layer, an interlayer insulation layer formed on the support layer and the first conductive pattern, a second conductive pattern formed on the interlayer insulation layer, and a via conductor formed in the interlayer insulation layer and connecting the first conductive pattern and the second conductive pattern, the interlayer insulation layer of the inductor component includes a magnetic layer and a resin layer covering the magnetic layer, the magnetic layer of the interlayer insulation layer in the inductor component includes a magnetic material and a resin material and has a first penetrating hole, the interlayer insulation layer has a second penetrating hole penetrating through the resin layer such that the second penetrating hole passes through the first penetrating hole and extends to the first conductive pattern, and the via conductor is formed in the second penetrating hole.

According to another aspect of the present invention, an inductor component includes a support layer, a first conductive pattern formed on the support layer, an interlayer insulation layer formed on the support layer and the first conductive pattern, a second conductive pattern formed on the interlayer insulation layer, and a via conductor formed in the interlayer insulation layer and connecting the first conductive pattern and the second conductive pattern. The interlayer insulation layer of the inductor component includes a magnetic layer and a resin layer covering the magnetic layer, the magnetic layer of the interlayer insulation layer in the inductor component includes a magnetic material and a resin material and has a first penetrating hole, the interlayer insulation layer has a second penetrating hole penetrating through the resin layer such that the second penetrating hole passes through the first penetrating hole and extends to the first conductive pattern, and the via conductor is formed in the second penetrating hole.

According to yet another aspect of the present invention, a method for manufacturing an inductor component includes forming a support layer on a support substrate, forming a first conductive pattern on the support layer, forming on the support layer and the first conductive pattern a magnetic layer including a magnetic material and a resin material and having a first penetrating hole penetrating through the magnetic layer such that the first penetrating hole extends to the first conductive pattern, forming a resin layer on the magnetic layer such that the resin layer covers the magnetic layer and that the resin layer fills the first penetrating hole formed in the magnetic layer, forming a second penetrating hole penetrating through the resin layer such that the second penetrating hole passes through the first penetrating hole in the magnetic layer and extends to the first conductive pattern, forming a second conductive pattern on the resin layer, forming a via conductor in the second penetrating hole such that the via conductor connects the first conductive pattern and the second conductive pattern, and removing the support substrate from the support layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 9(A)-9(B) are views showing steps of a method for manufacturing an inductor component of the first embodiment;

FIGS. 10(A)-10(E) are views showing steps of a method for manufacturing an inductor component according to the modified example of the first embodiment;

FIGS. 12(A)-12(C) are views showing steps of a method for manufacturing an inductor component of the second embodiment;

FIGS. 13(A)-13(E) are views showing steps of a method for manufacturing an inductor component of the second embodiment;

FIGS. 23(A)-23(B) are cross-sectional views of printed wiring boards according to modified examples of embodiments.

DETAILED DESCRIPTION OF THE EMBODIMENTS

Figure 1:
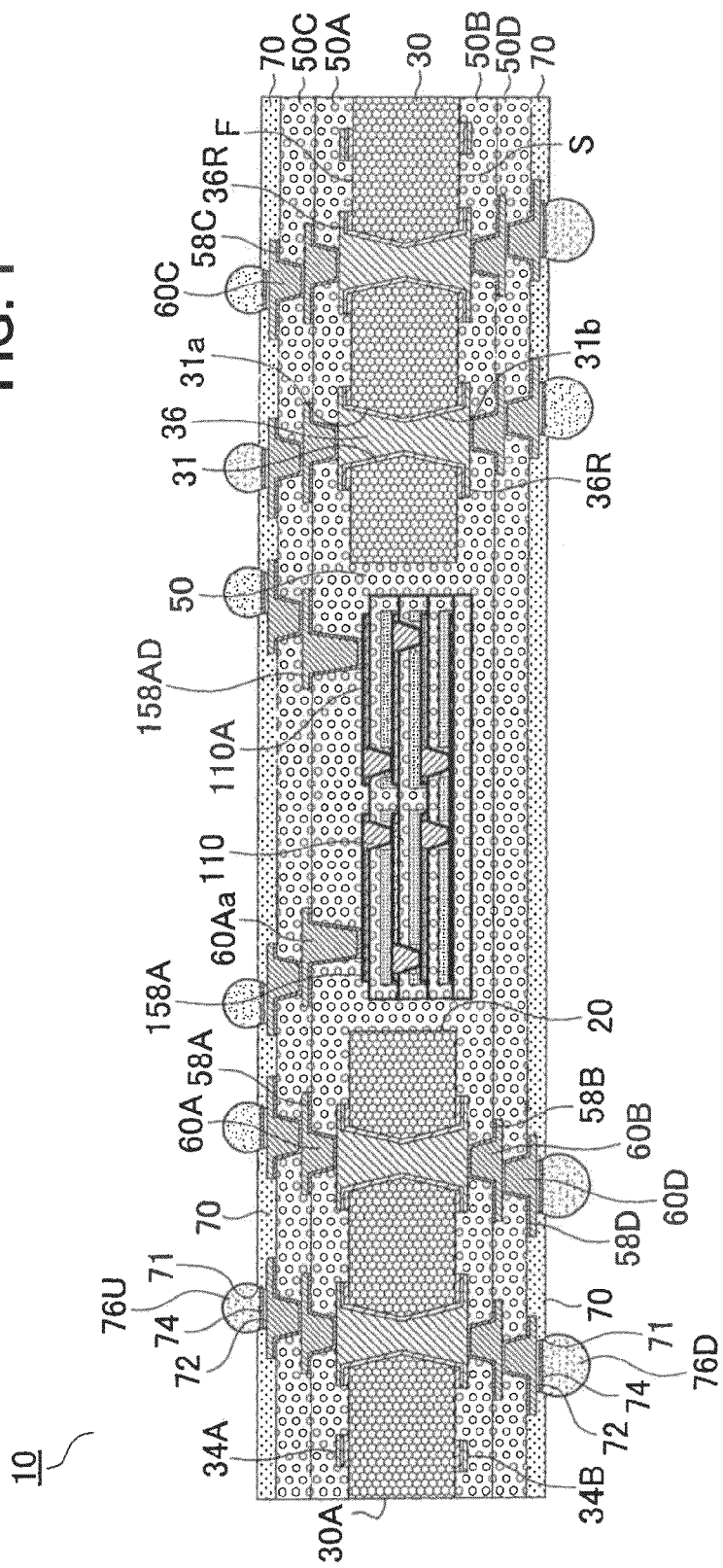
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

Figure 20:
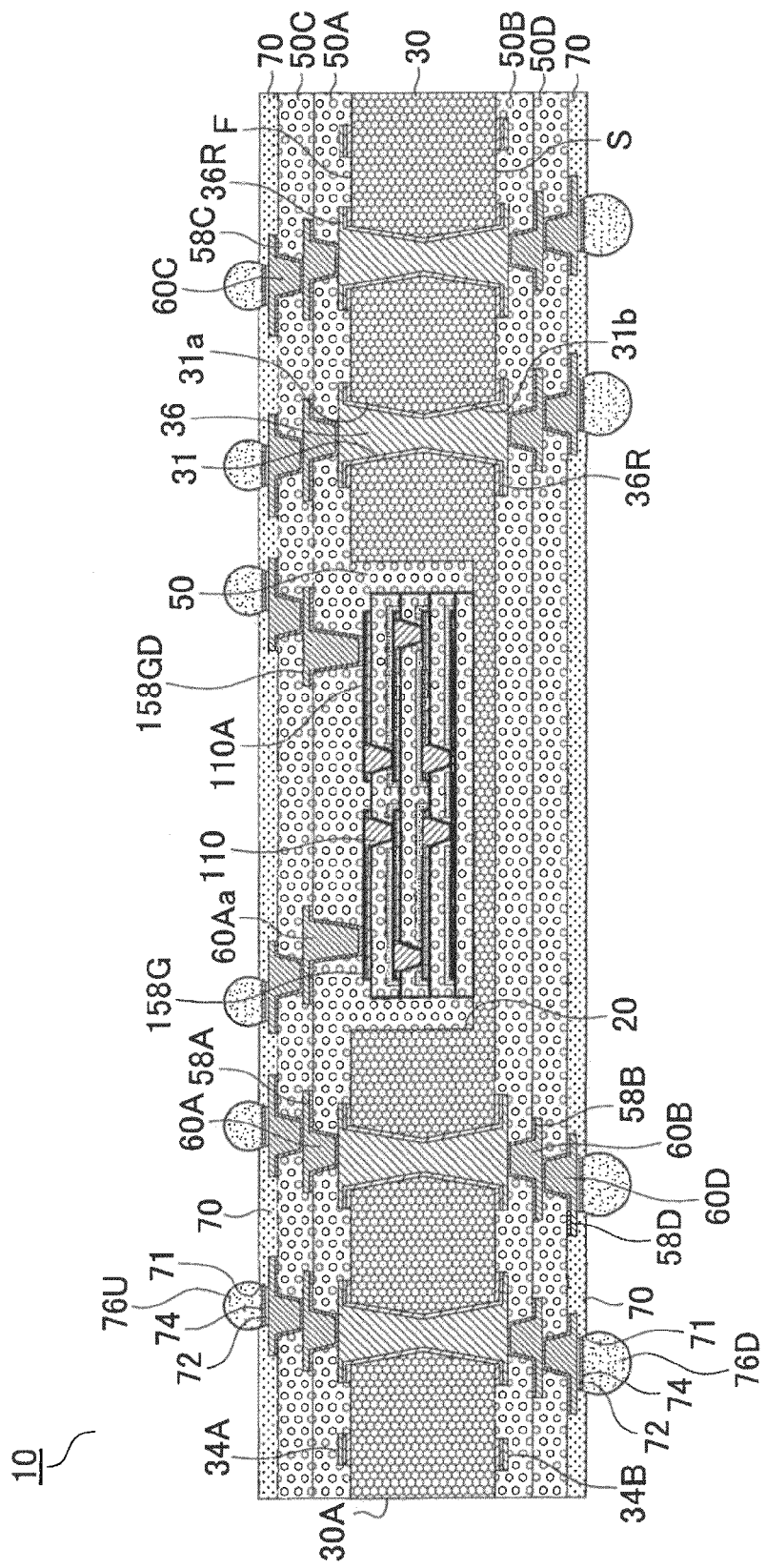
FIG. 20 is a cross-sectional view of a printed wiring board according to another modified example of the first embodiment.

FIG. 1 shows a cross-sectional view of printed wiring board 10 according to a first embodiment of the present invention. Printed wiring board 10 has core base 30 having first surface (F) and second surface (S) opposite the first surface. From a viewpoint of making printed wiring board 10 thinner, the thickness of core base 30 is preferred to be 200 μm or less, more preferably 100 μm or less. Core base 30 has cavity (opening section) 20. In the present embodiment, cavity 20 penetrates through core base 30, but it is also an option to modify it to have a bottom as shown in FIG. 20.

Inductor component 110 is accommodated in cavity 20. Resin 50 is filled in gaps between side walls of cavity 20 and inductor component 110. In doing so, inductor component 110 is secured in cavity 20.

Conductive patterns (36R) are formed respectively on first surface (F) and second surface (S) of core base 30. Core base 30 has multiple penetrating holes 31, and through-hole conductors 36 connecting conductive patterns (36R) are formed in penetrating holes 31. Through-hole conductor 36 is formed by filling penetrating hole 31 with plating. Penetrating hole 31 is made up of first opening portion (31a) which opens on first surface (F) of core base 30, and of second opening portion (31b) which opens on second surface (S). First opening portion (31a) tapers from the first surface toward the second surface, while second opening portion (31b) tapers from the second surface toward the first surface. First opening portion (31a) and second opening portion (31b) are connected inside core base 30.

A first buildup layer is formed on first surface (F) of core base 30 and on inductor component 110. The first buildup layer includes insulation layer (50A) on first surface (F) of core base 30 and on inductor component 110, conductive patterns (58A) on insulation layer (50A), and via conductors (60A) formed in insulation layer (50A) and connecting conductive patterns (58A) and conductive patterns (36R). Via conductors (60Aa) are further formed in insulation layer (50A) to connect conductive patterns (58A) and later-described electrodes of inductor component 110. In addition, the first buildup layer further includes insulation layer (50C) formed on insulation layer (50A) and on conductive patterns (58A), conductive patterns (58C) on insulation layer (50C), and via conductors (60C) formed in insulation layer (50C) and connecting conductive patterns (58A) and conductive patterns (58C).

A second buildup layer is formed on second surface (S) of core base 30 and on inductor component 110. In the second buildup layer, via conductors (60Aa) are omitted, in contrast to the above-described first buildup layer. Namely, since the structure of the second buildup layer is the same as that of the first buildup layer except for via conductors (60Aa), its description is omitted here.

Solder-resist layers 70 having openings 71 are formed on the first buildup layer and the second buildup layer. Conductive patterns (58C, 58D) exposed through the openings of solder-resist layers 70 work as pads on which later-described solder bumps are formed. Metal films (72, 74) made of Ni/Au, Ni/Pd/Au or the like are formed, and solder bumps (76U, 76D) are formed on metal films. An IC chip is mounted on printed wiring board 10 through solder bumps (76U) formed on the first buildup layer. Printed wiring board 10 is mounted on a motherboard through solder bumps (76D) formed on the second buildup layer.

Here, insulation layers (50A, 50B) formed on both surfaces of core base 30 are preferred to contain well-known core material made of glass cloth or the like. In doing so, rigidity is provided for printed wiring board 10. As a result, warping is suppressed in printed wiring board 10 caused by thermal history generated when forming solder bumps, for example. It is an option whether or not to include core material in insulation layers (50C, 50D) formed on insulation layers (50A, 50B) on both surfaces of core base 30. When insulation layers (50C, 50D) contain core material, the rigidity of printed wiring board 10 is further enhanced. On the other hand, when insulation layers (50C, 50D) do not contain core material, high-density conductive patterns (58C, 58D) are formed on insulation layers (50A, 50B).

Since inductor component 110 is built into core base 30 in the first embodiment, its characteristics (inductance, Q factor) do not depend on the number of conductive patterns in the buildup layers. When an inductor component in which interlayer insulation layers and inductor patterns are alternately laminated is built into a printed wiring board, the thickness of buildup layers (the number of layers of conductive patterns) on the core base do not increase in the first embodiment. Since the thickness of a core base is generally greater than the thickness of insulation layers on the core base, an inductor component with a large number of pattern layers can be built into a printed wiring board without increasing the number of insulation layers on the core base in the first embodiment. An inductor component with high inductance is built into a thin printed wiring board.

Moreover, if inductor patterns are formed in the first buildup layer or the second buildup layer, the difference in the rate of conductors in each buildup layer (remaining copper rate) may increase. In such a case, warping tends to occur in the printed wiring board. However, inductor patterns are not required to be formed in buildup layers in the present embodiment, allowing such a design to reduce the difference in the rate of conductors in each buildup layer (remaining copper rate). Warping in a printed wiring board is effectively suppressed.

Figure 2:
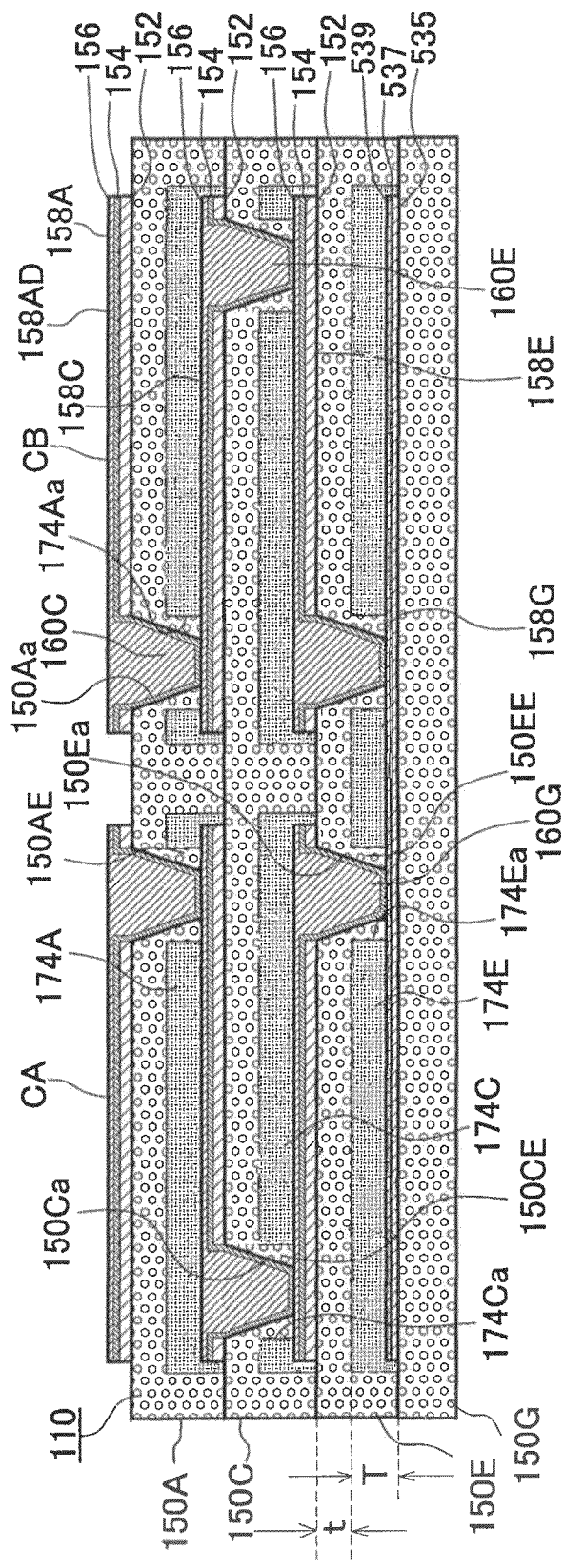
FIG. 2 is a cross-sectional view of an inductor component of the first embodiment.

FIG. 2 shows an enlarged view of inductor component 110 of the first embodiment. Inductor component 110 of the first embodiment includes lowermost resin layer (support layer) (150G), first inductor pattern (158G) formed on resin layer (150G), magnetic layer (174E) formed on inductor pattern (158G), first resin layer (150E) to cover magnetic layer (174E), and inductor pattern (158E) formed on first resin layer (150E).

Magnetic layer (174E) contains resin and magnetic particles. As for the resin of magnetic layer (174E), the following resins and their compositions, for example, are listed: epoxy resin, phenol resin, polybenzoxazole resin, polyphenylene resin, polybenzocyclobutene resin, polyarylene ether resin, polysiloxane resin, polyurethane resin, polyester resin, polyester urethane resin, fluoro resin, polyolefin resin, polycycloolefin resin, cyanate resin, polyphenylene ether resin, polystyrene resin or the like. As for magnetic particles in magnetic layer (174E), any material may be used as long as it is soft magnetic material: for example, iron, soft-magnetic iron alloy, nickel, soft-magnetic nickel alloy, cobalt, soft-magnetic cobalt alloy, soft-magnetic iron (Fe)-silicon (Si) alloy, soft-magnetic iron (Fe)-nitrogen (N) alloy, soft-magnetic iron (Fe)-carbon (C) alloy, soft-magnetic iron (Fe)-boron (B) alloy, soft-magnetic iron (Fe)-phosphorus (P) alloy, soft-magnetic iron (Fe)-aluminum (Al) alloy, soft-magnetic iron (Fe)-aluminum (Al)-silicon (Si) alloy, or the like.

The resin of resin layer (150G) is preferred to be formed using the same material as the resin contained in the above-described magnetic layer (174E). In doing so, adhesiveness is enhanced between magnetic layer (174E) and resin layer (150G).

Inductor pattern (158G) is formed with copper foil 535 on support layer (150G), electroless plated film 537 on copper foil 535, and electrolytic plated film 539 on electroless plated film 537. Inductor pattern (158E) is formed with copper foil 152 on first resin layer (150E), electroless plated film 154 on copper foil 152, and electrolytic plated film 156 on electroless plated film 154.

Magnetic layer (174E) has opening (174Ea). Resin layer (second resin layer) (150EE) is filled in the opening. In the present embodiment, second resin layer (150EE) is part of first resin layer (150E). Namely, first resin layer (150E) enters opening (174Ea).

First resin layer (150E) has penetrating hole (150Ea) that reaches inductor pattern (158G) exposed in opening (174Ea). Via conductor (160G) made of electroless plated film 154 and electrolytic plated film 156 formed thereon is formed in penetrating hole (150Ea). Inductor pattern (158G) and inductor pattern (158E) are connected by via conductor (160G).

Thickness (T) of magnetic layer (174E) is greater than thickness (t) of first resin layer (150E). Accordingly, inductance is enhanced and required characteristics are easier to obtain. Magnetic layer (174C) and resin layer (150C) are formed in that order on inductor pattern (158E).

Inductor pattern (158C) is formed with copper foil 152 on resin layer (150C), electroless plated film 154 on copper foil 152, and electrolytic plated film 156 on electroless plated film 154. Magnetic layer (174C) has opening (174Ca). Second resin layer (150CE) is filled in the opening. In the present embodiment, second resin layer (150CE) is part of resin layer (150C). Namely, resin layer (150C) enters opening (174Ca).

Resin layer (150C) has penetrating hole (150Ca) that reaches inductor pattern (158E) exposed in opening (174Ca). Via conductor (160E) made of electroless plated film 154 and electrolytic plated film 156 is formed inside penetrating hole (150Ca). Inductor pattern (158E) and inductor pattern (158C) are connected by via conductor (160E).

Magnetic layer (174A) and resin layer (150A) are formed in that order on inductor pattern (158C).

Inductor pattern (158A) is formed with copper foil 152 on resin layer (150A), electroless plated film 154 on copper foil 152, and electrolytic plated film 156 on electroless plated film 154. Magnetic layer (174A) has opening (174Aa). Second resin layer (150AE) is filled in the openings. In the present embodiment, second resin layer (150AE) is part of resin layer (150A). Namely, resin layer (150A) enters opening (174Aa).

Resin layer (150A) has penetrating hole (150Aa) that reaches inductor pattern (158C) exposed in opening (174Aa). Via conductor (160C) made of electroless plated film 154 and electrolytic plated film 156 formed thereon is formed inside penetrating hole (150Aa). Inductor pattern (158C) and inductor pattern (158A) are connected by via conductor (160C).

In the first embodiment, by positioning magnetic layers (174A, 174C, 174E) made of resin with mixed-in magnetic particles between inductor patterns located in different layers, magnetic permeability increases. Accordingly, required inductance is obtained using a thin inductor component having fewer layers, reducing the thickness of a printed wiring board with an inductor component built into a core base.

In addition, via conductor (160G) is formed in second penetrating hole (150Ea) formed in filler resin (second resin layer) (150EE) which is filled in first penetrating hole (174Ea) of magnetic layer (174E). Via conductors (160E, 160C) also have the same structure. Side surfaces of via conductors (160C, 160E, 160G) connecting inductor patterns (158A, 158C, 158E, 158G) do not touch magnetic layers whose adhesiveness with conductors is hard to secure, and make contact only with resin layers whose adhesiveness with conductors is enhanced when their surfaces are roughened. Accordingly, connection reliability of via conductors is enhanced. Also, since the magnetic layers are sandwiched by resin layers, and the magnetic layers and inductor patterns do not make direct contact, the adhesiveness of inductor patterns is improved, enhancing connection reliability.

Figure 3:
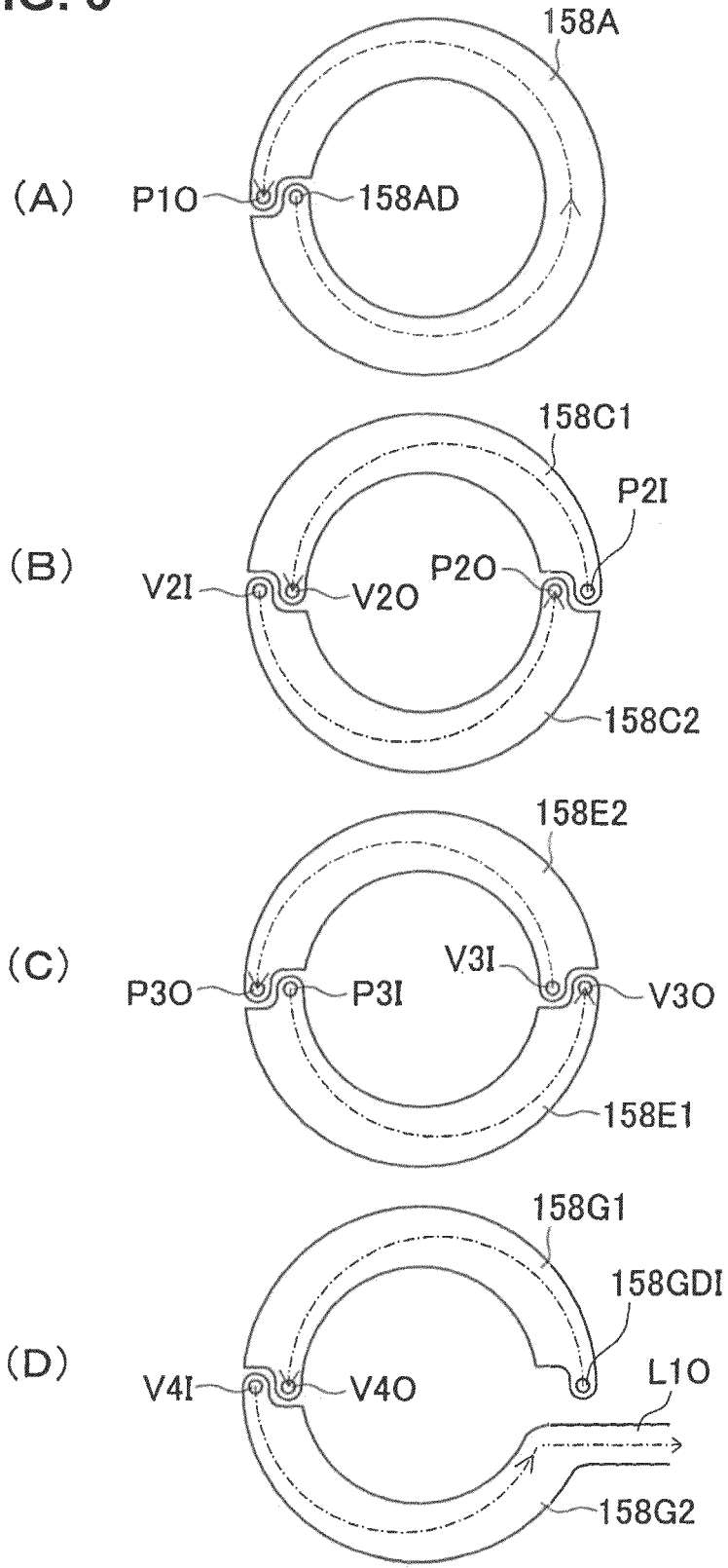
FIGS. 3(A)-3(D) are plan views showing each inductor pattern of an inductor component according to the first embodiment.

FIG. 3 shows an example of inductor patterns of an inductor component. Via conductor (60Aa) (connection via conductor in first buildup layer) shown in FIG. 1 is connected to electrode (input electrode) (158AD) of fourth inductor pattern (uppermost inductor pattern) (158A), and the current flows counterclockwise for substantially a circle to reach output connection portion (P1O) of first inductor pattern (158A) (FIG. 3(A)). Fourth inductor pattern (158A) is connected to input electrode (V2I) of third inductor pattern (158C1) by via conductor (160C). The current flows counterclockwise for substantially a semicircle to reach input connection portion (V3I) of second inductor pattern (158E2) by via conductor (160E) (FIG. 3(C)). Second inductor pattern (158E2) is connected to input via pad (V4I) of first inductor pattern (158G2) by via conductor (160G) (FIG. 3(D)). The current flows counterclockwise for substantially a semicircle to reach input connection portion (L1O) of first inductor pattern (158G2) and is output to an adjacent laminated inductor.

Meanwhile, output from the adjacent laminated inductor is connected to first inductor pattern (158G1) from input pad (158GDI) (FIG. 3(D)). The current flows through first inductor pattern (158G1) counterclockwise for substantially a semicircle, and is connected from output via pad (V4O) of first inductor pattern (158G1) to input connection portion (P3I) of second inductor pattern (158E1) by via conductor (160G) (FIG. 3(C)). The current flows counterclockwise for a semicircle to reach input via pad (P2I) of third inductor pattern (158C1) (FIG. 3(B)). The second inductor pattern is connected to output electrode (158AD) of fourth inductor pattern (158E2) by via conductor (160C) (FIG. 3(A)). Output electrode (158AD) is connected to a conductive pattern (for power source) by via conductor (60Aa) in the first buildup layer.

The fourth inductor pattern (uppermost inductor pattern) is formed with a wiring pattern shaped in substantially a circular coil. The other inductor patterns except for the lowermost inductor pattern are formed with two wiring patterns. In the first embodiment, a laminated coil is connected to an identically shaped adjacent laminated coil through connection wiring (L1O). Inductor component 110 of the first embodiment is made up of two laminated coils. In the present embodiment, a via conductor in the first buildup layer is connected to each output electrode (such as 158AD) of each laminated inductor. Each laminated coil is connected parallel by conductive patterns in the first buildup layer. When multiple inductors are connected parallel, current flowing in each inductor is divided. As a result, the resistance in a single inductor is lowered, and the characteristics (Q factor) are thought to be improved.

Figure 4:
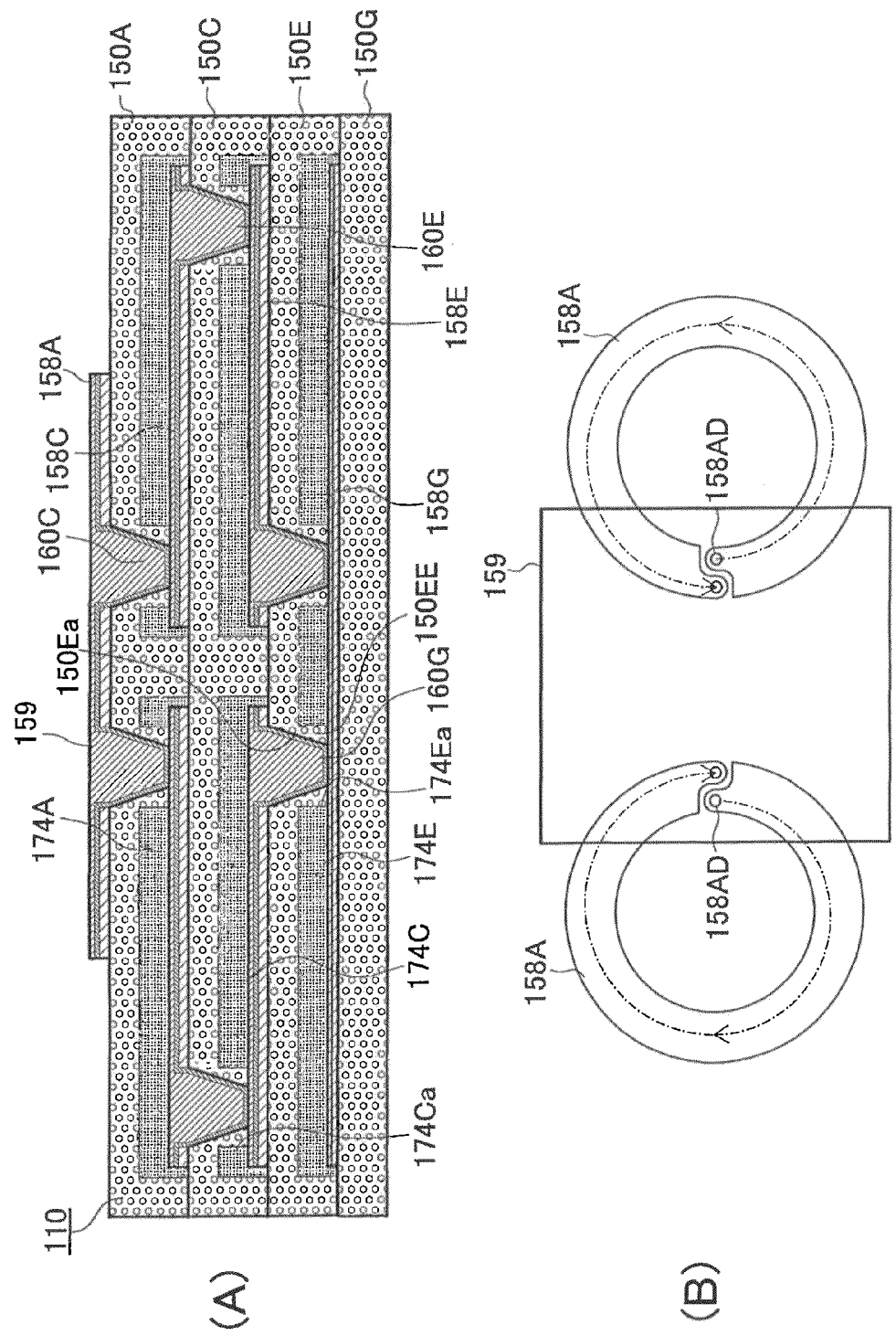
FIGS. 4(A) and 4(B) are a cross-sectional view and a plan view of an inductor component according to a modified example of the first embodiment.
Figure 5:
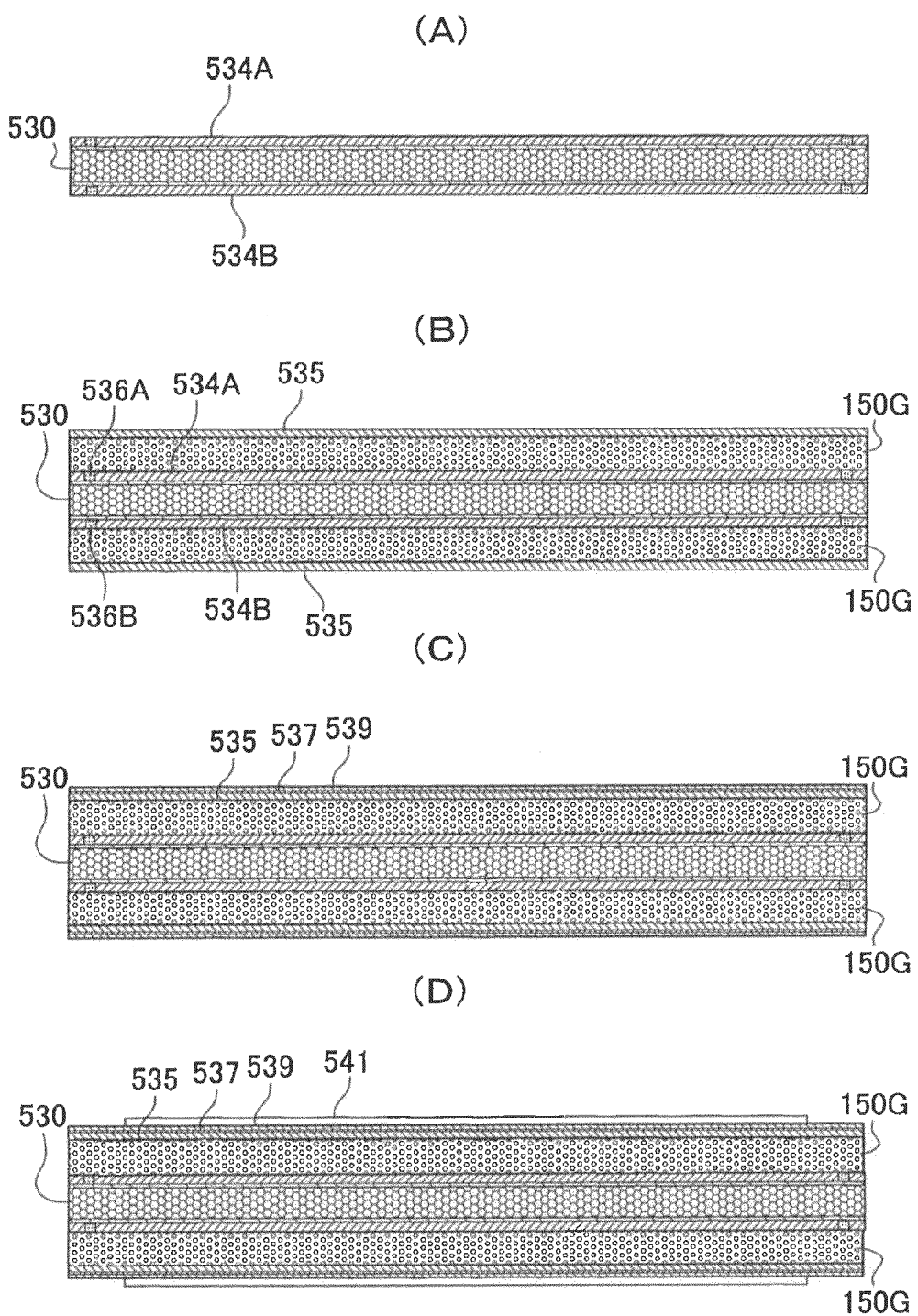
FIGS. 5(A)-5(D) are views showing steps of a method for manufacturing an inductor component in the first embodiment.
Figure 6:
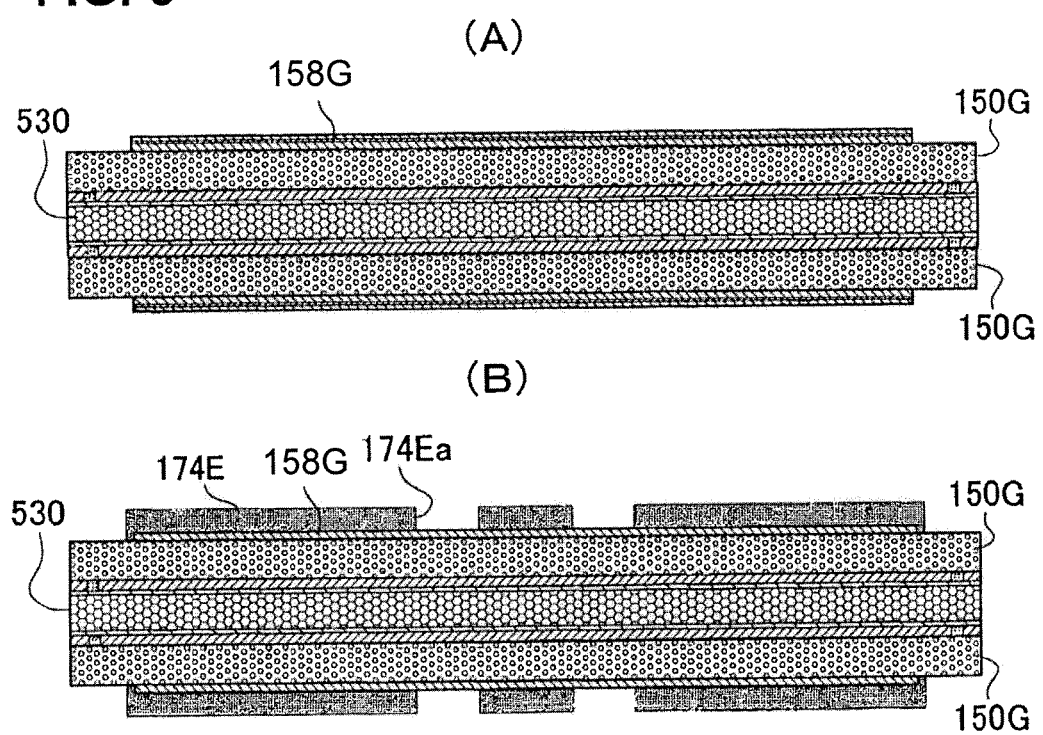
FIGS. 6(A)-6(B) are views showing steps of a method for manufacturing an inductor component of the first embodiment.
Figure 7:
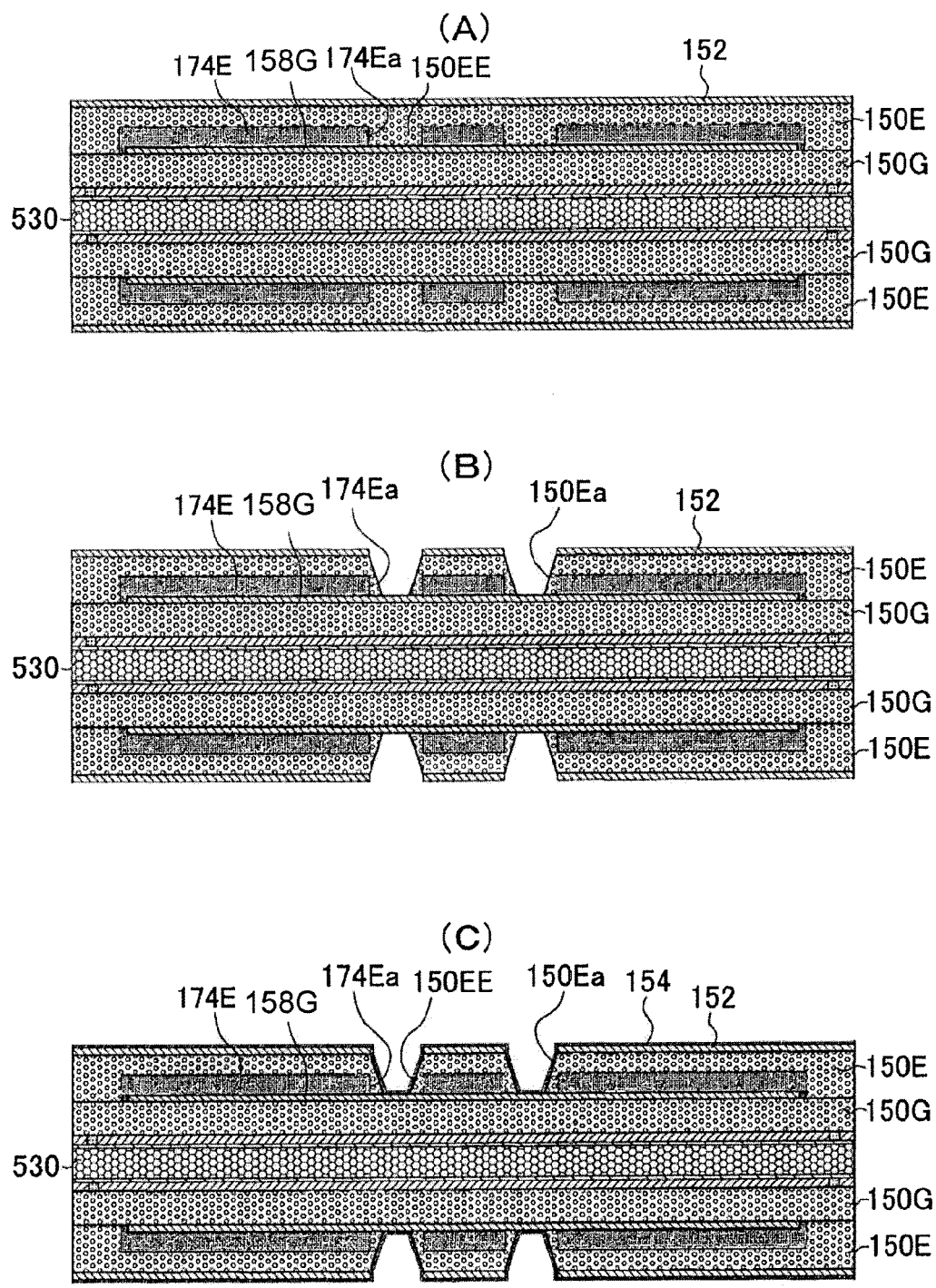
FIGS. 7(A)-7(C) are views showing steps of a method for manufacturing an inductor component of the first embodiment.
Figure 8:
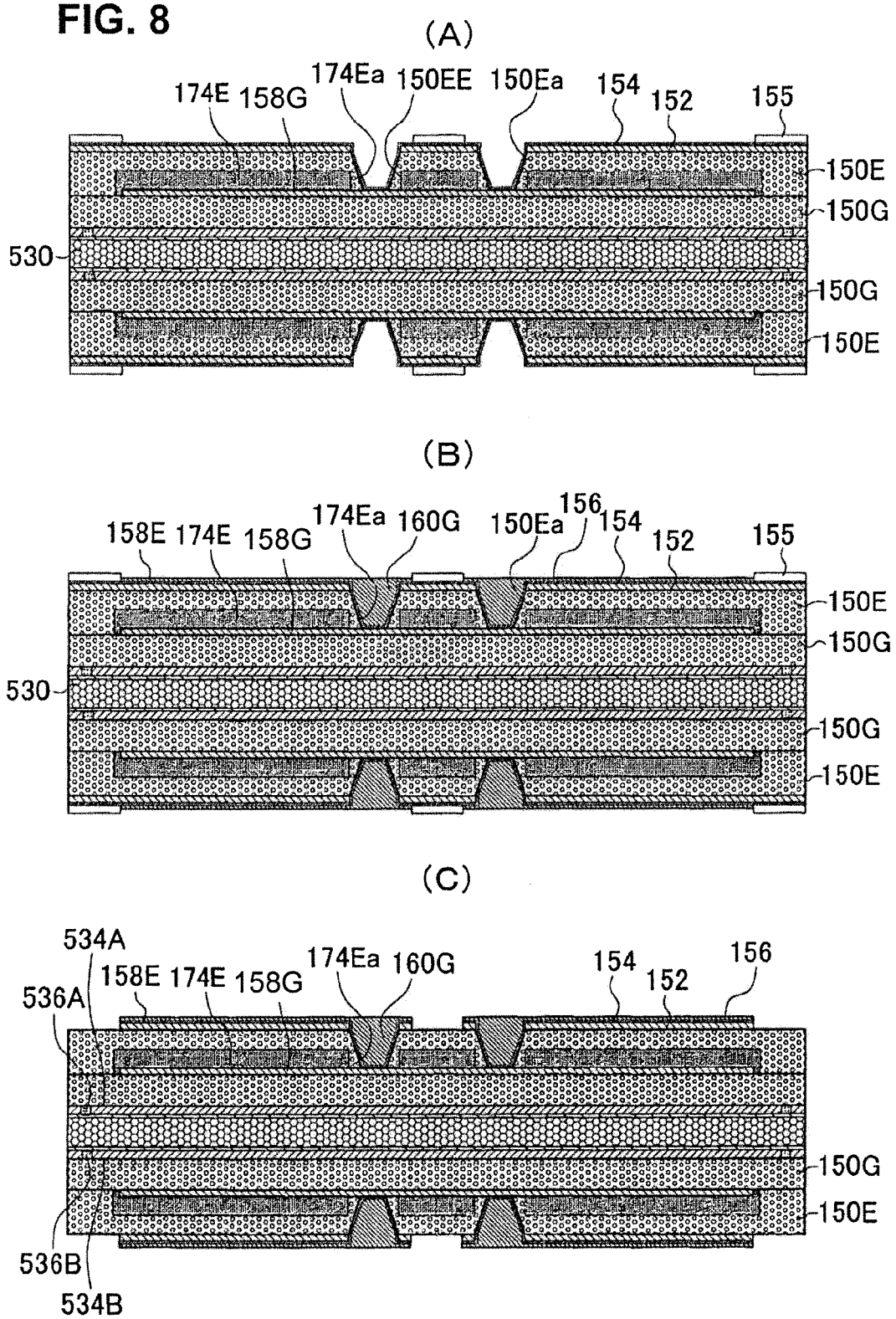
FIGS. 8(A)-8(C) are views showing steps of a method for manufacturing an inductor component of the first embodiment.

Here, when inductor component 110 is formed with multiple laminated inductors, inductor component 110 may have common output electrode 159 as shown in FIGS. 4(A) and (B). In such a case as well, each laminated inductor 110 is connected parallel. Output electrode 159 is placed on uppermost interlayer insulation layer (150A), and via conductors in the first buildup layer are connected to output electrode 159.

It is an option for the inductor component to be covered with resin film containing inorganic particles. The resin film is not magnetic. The resin film contains resin such as epoxy in addition to particles. The bonding strength of the inductor component and filler resin becomes higher. Defects such as line breakage of conductive patterns caused by delamination between the inductor component and filler resin are prevented in the printed wiring board. Other than magnetic particles, resin film may also contain inorganic non-magnetic particles. As inorganic non-magnetic particles, silica particles and alumina particles are listed. The thermal expansion coefficient of the resin film is lowered.

Inductor component 110 is formed by alternately laminating interlayer insulation layers and inductor patterns, and has electrodes to be connected to via conductors of the buildup layer. Therefore, by adjusting the number of interlayer insulation layers and the number of inductor pattern layers, the thickness of an inductor component is adjusted. Therefore, an inductor component is manufactured by considering the thickness of a core base. Then, the inductance is adjusted by the number of inductor pattern layers and the number of laminated inductors. Accordingly, the inductor component according to an embodiment of the present invention is suitable for a component to be built into a core base. Also, since a printed wiring board and an inductor component are connected by connection via conductors, the inductor component of an embodiment of the present invention is suitable for a component to be built into a printed wiring board. It is an option for the inductor component to be covered by non-magnetic resin film. Deterioration of the inductor component is suppressed.

In an embodiment of the present invention, buildup layers and inductor components are manufactured by the technology used in technical fields of printed wiring boards. Since buildup layers and inductor components are manufactured separately, the thickness of wiring patterns of inductor patterns is set greater than the thickness of conductive layers of buildup layers. Accordingly, an inductor component with lower resistance is built into a printed wiring board, and a printed wiring board with fine conductive circuits is achieved. When the thickness of wiring patterns of inductor patterns is divided by the thickness of conductive layers of buildup layers, the obtained value is preferred to be 1.2 to 3. Inductor components with lower resistance and higher inductance are obtained. Thin printed wiring boards with fine circuits are achieved.

FIG. 5 through FIG. 13 show steps for manufacturing an inductor component according to the first embodiment.

Preparing Paste Material Containing Magnetic Particles

Paste material is prepared by adding magnetic particles made of 85 g of epoxy resin (brand name: Epicoat 1007 made by Japan Epoxy Resin Co., Ltd.) and iron (III) oxide, or the like, to a mixed solvent containing 6.8 g of MEK and 27.2 g of xylene. As examples of magnetic particles, ferrichrome, cobalt iron oxide, barium ferrite and the like are listed.

Commercially available double-sided copper-clad laminate 530 and copper foils (534A, 534B) are prepared, and the copper foils are laminated on both surfaces of the double-sided copper-clad laminate. Ultrasound is used to bond the peripheries of copper foils and the periphery of double-sided copper-clad laminate 530 as a support plate (FIG. 5(A)). Bonding portions are shown as (536A, 536B) in FIG. 5(A). Film for support layers is laminated on copper foils (534A, 534B). Such film contains copper foil 535 on its surface. Then, the film is cured to form lowermost resin layer (150G) (FIG. 5(B)).

Next, electroless plated film 537 and electrolytic plated film 539 are formed in that order on copper foil 535 (FIG. 5(C)). Etching resist 541 having openings at predetermined portions is formed (FIG. 5(D)). Then, copper foil 535, electroless plated film 537 and electrolytic plated film 539 exposed from the etching resist are removed by using an etching solution. Accordingly, inductor pattern (158G) is formed on support layer (150G) (FIG. 6(A)). Other inductor patterns as well as inductor pattern (158G) may be roughened using an etching solution.

The above-described paste material is printed on inductor pattern (158G). During that time, the paste material is printed in such a way that opening (174Ea) is formed in a portion where later-described via conductor (160G) is formed, and then is calcined at a predetermined temperature. Magnetic layer (174E) is formed (FIG. 6(B)).

Film is laminated on magnetic layer (174E), part of such film is filled in the opening of magnetic layer (174E), and resin layer (150E) and copper foil 152 are laminated (FIG. 7(A)). Opening (150Ea) is formed by a laser. Opening (150Ea) penetrates through filler resin (150EE) and resin layer (150E) (FIG. 7(B)). In an embodiment of the present invention, since a laser irradiation is required only on resin portions, openings are formed in a short time compared with a laser irradiation on a magnetic layer, and excessive irregular surfaces are not formed on side walls of such openings. After that, the surface of copper foil 152 and the side wall of opening (150Ea) may also be roughened.

Electroless plated film 154 is formed on copper foil 152 on resin layer (150E) and on the side wall of opening (150Ea) (FIG. 7(C)). Plating resist 155 with a predetermined pattern is formed on the electroless plated film (FIG. 8(A)). At that time, the plating resist is formed on resin layer (150E) with copper foil 152 placed in between. Thus, compared with situations where a plating resist is directly formed on a magnetic layer with excessive irregular surfaces, adhesiveness with plating resist is secured in an embodiment of the present invention. Electrolytic film 156 is formed on electroless plated film 152 exposed from the plating resist (FIG. 8(B)). Then, the plating resist is removed, and the electroless plated film and copper foil between portions of electrolytic plated film 156 are removed (FIG. 8(C)). Inductor pattern (158E) is formed with copper foil 152, electroless plated film 154 and electrolytic plated film 156 on the electroless plated film.

Steps shown in FIGS. 7(A)~8(C) are repeated, resin layer (150C), via conductor (160E), inductor pattern (158E), resin layer (150A), via conductor (160C) and inductor pattern (158A) are formed (FIG. 9(A)).

The laminate is cut using a router or the like along the inside of bonding portions (536A, 536B) shown in FIG. 9(A). The laminate is separated into laminated coils with copper foils (534A, 534B) and double-sided copper-clad laminate 530 (FIG. 9(B)). PET film is laminated on outermost inductor pattern (158A) and the uppermost resin layer, and copper foil (534A) is etched away. Then, the PET film is removed, and inductor component 110 is completed (FIG. 2).

Modified Example of First Embodiment

FIG. 10 shows a method for manufacturing an inductor component for a printed wiring board according to a modified example of the first embodiment. Resin layer (150E) is formed by the steps shown in FIG. 5(A)~FIG. 7(A) in the first embodiment (FIG. 10(A)). In a modified example of the first embodiment, copper foil is not laminated. Also, a support plate is not shown in the drawings. Using a laser, second penetrating hole (150Ea) is formed in first penetrating hole (174Ea) to penetrate through resin layer (150E) and filled resin (150EE) and to reach inductor pattern (158G) (FIG. 10(B)). The inside of second penetrating hole (150Ea) and the surface of resin layer (150E1) are roughened by a treatment using a chemical solution that dissolves the above-mentioned roughening organic particles in the resin layer (FIG. 10(C)).

Electroless plated film 154 is formed on the surface of resin layer (150E1) and in second penetrating hole (105Ea) (FIG. 10(D)). Plating resist with a predetermined pattern is formed on the electroless plated film. Electrolytic plating is performed to form electrolytic plated film 156 on electroless plated film 154 exposed from the plating resist. Then, the plating resist is removed, and the electroless plated film between portions of electrolytic plated film 156 is removed. Inductor pattern (158E) and via conductor (160G) made of electroless plated film 154 and electrolytic plated film 156 are formed (FIG. 10(E)). Subsequent procedures are the same as in the first embodiment.

FIGS. 15~19 show a method for manufacturing printed wiring board 10 of the first embodiment.

(1) The starting material is double-sided copper-clad laminate (30Z) made of insulative base (30A) and copper foils 32 laminated on both of its surfaces. The thickness of the insulative base is 100~400 μm. If the thickness is less than 100 μm, the substrate strength is too low. If the thickness exceeds 400 μm, the thickness of a printed wiring board increases. The insulative base has first surface (F) and second surface (S) opposite the first surface. A black-oxide treatment, not shown in the drawings, is conducted on surfaces of copper foils 32 (FIG. 15(A)).

(2) A laser is irradiated on double-sided copper-clad laminate (30Z) from the first-surface (F) side of the insulative base to form first opening portion (31a) which becomes narrower from the first surface of the insulative base toward the second surface (FIG. 15(B)).

(3) A laser is irradiated on double-sided copper-clad laminate (30Z) from the second-surface (S) side of the insulative base to form second opening portion (31b) which becomes narrower from the second surface of the insulative base toward the first surface (FIG. 15(C)). Second opening portion (31b) is connected to first opening portion (31a) in the insulative base to form penetrating hole 31 for a through-hole conductor.

(4) Electroless plating is performed to form electroless plated film 33 on the inner wall of penetrating hole 31 and on copper foils 32 (FIG. 15(D)).

(5) Electrolytic plating is performed to form electrolytic plated film 37 on electroless plated film 33. Through-hole conductor 36 is formed in a penetrating hole. Through-hole conductor 36 is made of electroless plated film 33 formed on the inner wall of a penetrating hole and electrolytic plated film 37 filled in the penetrating hole (FIG. 15(E)).

(6) Etching resist 35 with a predetermined pattern is formed on electrolytic plated film 37 on surfaces of core base 30 (FIG. 15(F)).

(7) Electrolytic plated film 37, electroless plated film 33 and copper foil 32 exposed from the etching resist are removed. Then, the etching resist is removed, and conductive layers (34A, 34B) and through-hole conductor 36 are formed (FIG. 16(A)).

(8) In the central portion of insulative base (30A), a laser is used to form opening 20 for accommodating an inductor component. A core base is completed (FIG. 16(B)).

(9) Tape 94 is attached to second surface (S) of core base 30. Opening 20 is covered by the tape (FIG. 16(C)). PET film is listed as an example of tape 94.

(10) Inductor component 110 is placed on tape 94 exposed through opening 20 (FIG. 16(D)). The thickness of an inductor component accommodated in opening 20 of the core base is 30%~100% of the thickness of the core base.

(11) B-stage prepreg is laminated on first surface (F) of core base 30. Resin seeps out from the prepreg into the opening by thermal pressing, filling opening 20 with filler (resin filler) 50 (FIG. 16(E)). The gap between the inner walls of the opening and the inductor component is filled with filler. The inductor component is secured in the core base. Resin film for interlayer insulation layers may also be laminated instead of prepreg. Prepreg contains reinforcing material such as glass cloth, but resin film for interlayer resin layers does not contain reinforcing material. Both of them are preferred to contain inorganic particles such as glass particles. The filler contains inorganic particles such as silica particles.

(12) After the tape is removed (FIG. 17(A)), B-stage prepreg is laminated on second surface (S) of core base 30. Prepreg on the first and second surfaces of the core base is cured. Insulation layers (interlayer resin layers) (50A, 50B) are formed on the first surface and the second surface of the core base (FIG. 17(B)).

(13) A CO2 gas laser is used from the first-surface side so that opening (51A) for a connection via conductor reaching electrode (158AD) of inductor component 110 is formed in insulation layer (50A). Simultaneously, opening 51 for a via conductor reaching through-hole conductor 36 or conductive layer (34A) is formed. From the second-surface side, opening 51 for a via conductor reaching conductive layer (34B) or through-hole conductor 36 is formed in insulation layer (50B) (FIG. 17(C)). Surfaces of insulation layers (50A, 50B) are roughened (not shown in the drawings).

(14) Electroless plating is performed to form electroless plated film 52 on the inner walls of via-conductor openings and on the insulation layers (FIG. 17(D)).

(15) Plating resist 54 is formed on electroless plated film 52 (FIG. 18(A)).

(16) Next, electrolytic plating is performed to form electrolytic plated film 56 on the electroless plated film exposed from the plating resist (FIG. 18(B)).

(17) Next, plating resist 54 is removed using an amine solution. Then, electroless plated film 52 exposed from the electrolytic copper-plated film is etched away. Conductive layers (58A, 58B) made of electroless plated film 52 and electrolytic plated film 56 are formed. Conductive layers (58A, 58B) include multiple conductive circuits and lands of via conductors. At the same time, via conductors (60A, 60B) and connection via conductor (60Aa) are formed (FIG. 18(C)). Via conductors (60A, 60B) connect the conductive layers of the core base and through-hole conductors with conductive layers (58A, 58B) on the insulation layers. Connection via conductor (60Aa) connects an electrode of the inductor component (input electrode, output electrode) with conductive layer (58A) on the insulation layer.

(18) Treatments in FIGS. 17(A)~18(C) are repeated to form uppermost and lowermost insulation layers (50C, 50D) on insulation layers (50A, 50B). Conductive layers (58C, 58D) are formed on uppermost and lowermost insulation layers (50C, 50D). Via conductors (60C, 60D) are formed in uppermost and lowermost insulation layers (50C, 50D). Conductive layers (58A, 58B) and conductive layers (58C, 58D) are connected by via conductors (60C, 60D) (FIG. 18(D)). A first buildup layer is formed on the first surface of the core base, and a second buildup layer is formed under the second surface of the core base. Each buildup layer includes insulation layers, conductive layers and via conductors for connecting different conductive layers. In the first embodiment, the first buildup layer further includes a connection via conductor.

(19) Solder-resist layers 70 having openings 71 are formed on the first and second buildup layers (FIG. 19(A)). Openings 71 expose upper surfaces of conductive layers and via conductors. Such portions work as pads.

(20) Metal film made of nickel layer 72 and gold layer 74 on nickel layer 72 are formed on the pads (FIG. 19(B)). Instead of nickel-gold layers, nickel-palladium-gold layers may also be used for metal film. In the printed wiring board shown in FIG. 1, no conductive pattern is formed in a region directly under inductor component 110. In such a case, the difference is great between the rate of conductors in the first buildup layer and the rate of conductors in the second buildup layer. Thus, warping may tend to occur in such a printed wiring board. Therefore, it is an option to form a predetermined conductive pattern in a region directly under inductor component 110 so that the difference in the rates of conductors in both buildup layers is reduced. As another example, it is preferred that the insulation layers in the first buildup layer not contain reinforcing material and that the insulation layers in the second buildup layer contain reinforcing material. Accordingly, warping of the printed wiring board is reduced.

(21) After that, solder bump (76U) is formed on a pad in the first buildup layer, and solder bump (76D) is formed on a pad in the second buildup layer. Printed wiring board 10 with solder bumps is completed (FIG. 1).

An IC chip is mounted on printed wiring board 10 through solder bump (76U) (not shown in the drawings). Then, the printed wiring board is mounted on a motherboard through solder bump (76D).

Second Embodiment

Figure 11:
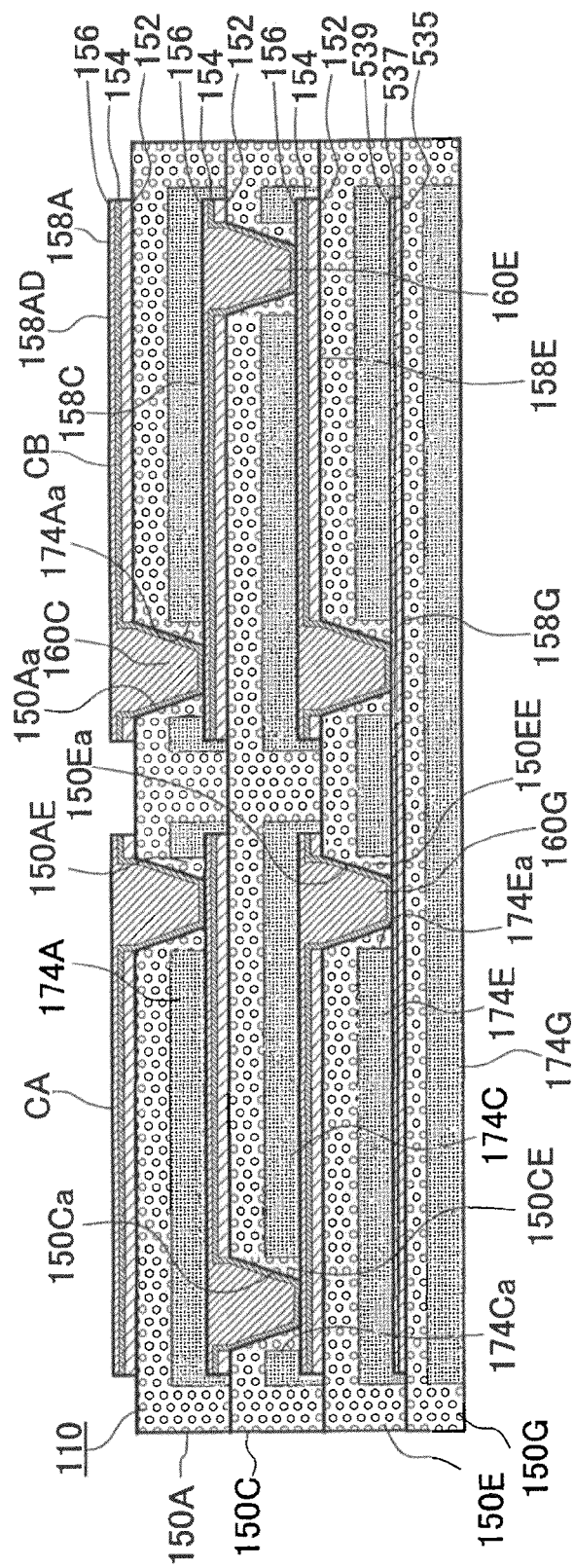
FIG. 11 is a cross-sectional view of an inductor component according to a second embodiment.

FIG. 11 is an enlarged view of inductor component 110 of a second embodiment. Compared with the first embodiment, inductor component 110 of the present embodiment also includes a magnetic layer in a lowermost support layer. Namely, the support layer has the same structure as interlayer insulation layers. The inductor component of the second embodiment is accommodated in the core base of a printed wiring board, the same as in the first embodiment.

The inductor component has the following: lowermost magnetic layer (174G), resin layer (150G) and first inductor pattern (158G); magnetic layer (174E) on inductor pattern (158G), resin layer (150E) and inductor pattern (158E); magnetic layer (174C) on inductor pattern (158E), resin layer (150C) and inductor pattern (158C); magnetic layer (174A) on inductor pattern (158C), resin layer (uppermost resin layer) (150A) and inductor pattern (158A). Electrode (158AD) is included in inductor pattern (158A).

The inductor component is built into the core base so that electrode (158AD) faces the first surface of the core base. First inductor pattern (158G) is formed on first magnetic layer (lowermost magnetic layer) (174G) and first resin layer (lowermost resin layer) (150G).

Inductor pattern (158G) is made up of copper foil 535 on support layer (150G), electroless plated film 537 on copper foil 535, and electrolytic plated film 539 on electroless plated film 537. Inductor pattern (158E) is made up of copper foil 152 on first resin layer (150E), electroless plated film 154 on copper foil 152, and electrolytic plated film 156 on electroless plated film 154.

Magnetic layer (174E) has opening (174Ea). Resin layer (second resin layer) (150EE) is filled in the opening Second resin layer (150EE) is part of first resin layer (150E) in the present embodiment. Namely, first resin layer (150E) enters opening (174Ea).

First resin layer (150E) has penetrating hole (150Ea) that reaches inductor pattern (158G) exposed through opening (174Ea). Via conductor (160G) made of electroless plated film 154 and electrolytic plated film 156 is formed in penetrating hole (150Ea). Inductor pattern (158G) and inductor pattern (158E) are connected by via conductor (160G).

Here, thickness (T) of magnetic layer (174E) is greater than thickness (t) of first resin layer (150E). In setting so, inductance is enhanced and required characteristics are easier to achieve. Magnetic layer (174C) and resin layer (150C) are formed in that order on inductor pattern (158E).

Inductor pattern (158C) is made up of copper foil 152 on resin layer (150C), electroless plated film 154 on copper foil 152, and electrolytic plated film 156 on electroless plated film 154. Magnetic layer (174C) includes opening (174Ca). Second resin layer (150CE) is filled in the opening. In the present embodiment, second resin layer (150CE) is part of resin layer (150C). Namely, resin layer (150C) enters opening (174Ca).

Resin layer (150C) includes penetrating hole (150Ca) reaching inductor pattern (158E) exposed through opening (174Ca). Via conductor (160E) made of electroless plated film 154 and electrolytic plated film 156 is formed in penetrating hole (150Ca). Inductor pattern (158E) and inductor pattern (158C) are connected by via conductor (160E).

Magnetic layer (174A) and resin layer (150A) are formed in that order on inductor pattern (158C).

Inductor pattern (158A) is made up of copper foil 152 on resin layer (150A), electroless plated film 154 on copper foil 152, and electrolytic plated film 156 on electroless plated film 154. Magnetic layer (174A) includes opening (174Aa). Second resin layer (150AE) is filled in the opening. In the present embodiment, second resin layer (150AE) is part of resin layer (150A). Namely, resin layer (150A) enters opening (174Aa).

Resin layer (150A) includes penetrating hole (150Aa) reaching inductor pattern (158C) exposed through opening (174Aa). Via conductor (160C) made of electroless plated film 154 and electrolytic plated film 156 is formed in penetrating hole (150Aa). Inductor pattern (158C) and inductor pattern (158A) are connected by via conductor (160C).

Second magnetic layer (174E) and second resin layer (150E) are formed on first inductor pattern (158G) and the first resin layer, and second inductor pattern (158E) is formed on the second resin layer. First penetrating hole (174Ea) is formed in second magnetic layer (174E). Filler resin (150EE) from second resin layer (150E) is filled in first penetrating hole (174Ea). Second penetrating hole (150Ea) is formed in second resin layer (150E) and in filler resin (150EE), which is in the first penetrating hole. Via conductor (160G) is formed in second penetrating hole (150Ea), and first inductor pattern (158G) and second inductor pattern (158E) are connected by via conductor (160G). Third magnetic layer (174C) and third resin layer (150C) are formed on second inductor pattern (158E) and second resin layer (150E). Third inductor pattern (158C) is formed on the third resin layer. Second inductor pattern (158E) and third inductor pattern (158C) are connected by via conductor (160E) which is formed in the same manner as above-described via conductor (160G). Fourth magnetic layer (uppermost magnetic layer) (174A) and fourth resin layer (uppermost resin layer) (150A) are formed on third inductor pattern (158C) and on the third resin layer. Fourth inductor pattern (uppermost inductor pattern) (158A) is formed on the fourth resin layer. Third inductor pattern (158C) and fourth inductor pattern (158A) are connected by via conductor (160C) which is formed in the same manner as above-described via conductor (160G).

Part of fourth inductor pattern (158A) works as electrode (158AD). Connection via conductor (60Aa) is formed on electrode (158AD). The inductor component of the second embodiment has alternately laminated resin layers, magnetic layers and inductor patterns, and inductor patterns in different layers are connected by via conductors in the resin layers. The inductor component of the present embodiment has multiple laminated inductors (CA, CB), and each laminated inductor is connected parallel or in series. The inductor component in FIG. 11 is formed with two laminated inductors (CA: left in the drawing, CB: right in the drawing).

Magnetic layers (174A, 174C, 174E) are included in their respective interlayer resin layers (150A, 150C, 150E) sandwiched by inductor patterns (158A, 158C, 158E, 158G). Magnetic layer (174G) is formed in the layer under inductor pattern (158G). Magnetic layers (174A, 174C, 174E, 174G) are made of resin containing magnetic particles such as iron-nickel alloy, iron alloy or amorphous alloy, and they are made of the same material. The amount of magnetic particles is 30-60 vol. %. By positioning magnetic layers (174A, 174C, 174E) made of resin with mixed-in magnetic particles between each inductor pattern, and by forming magnetic layer (174G) outside inductor pattern (158G), magnetic permeability increases. Accordingly, required inductance is achieved using a thin inductor component with fewer layers. Therefore, the thickness of a printed wiring board with an inductor component built into the core substrate is reduced.

In addition, via conductor (160G) is formed in second penetrating hole (150Ea) in filler resin (150EE) which is filled in first penetrating hole (174Ea) formed in magnetic layer (174E). Via conductors (160E, 160C) are formed in the same manner. Accordingly, the same effects as in the first embodiment are achieved.

Magnetic film is preferred to be formed on the lowermost inductor pattern of the inductor component. It is an option to further form magnetic film on the uppermost inductor pattern, and to form magnetic film on a side wall of the inductor component. Magnetic flux in the inductor component seldom leaks outside. There is no need to form a region without a conductive circuit directly on or directly under the inductor component to prevent reduced inductance and a lowered Q factor. Volumes of conductive circuits in the first buildup layer and the second buildup layer seldom become unbalanced. A printed wiring board with less warping is provided.

FIGS. 12~44 show a method for manufacturing an inductor component of the second embodiment. The same magnetic paste as in the first embodiment is printed on a support member (such as a double-sided copper-clad laminate) (not shown in the drawings), and is cured to form magnetic layer (174G). Resin layer (150G) is formed on magnetic layer (174G) (FIG. 12(A)). Copper foil 535 is formed on a surface of resin layer (150G). Resin layers in the second embodiment are made of resin such as epoxy, roughening organic particles, and inorganic particles for adjusting thermal expansion coefficients.

Next, electroless plated film 537 and electrolytic plated film 539 are formed in that order on copper foil 535 (FIG. 12(B)). Etching resist 541 with predetermined openings is formed (FIG. 12(C)). Then, copper foil 535, electroless plated film 537 and electrolytic plated film 539 exposed from the etching resist are removed using an etching solution. Accordingly, inductor pattern (158G) is formed on resin layer (150G) (FIG. 13(A)). Inductor pattern (158G) along with other inductor patterns may be roughened using an etching solution.

Inductor pattern (158G) is covered with magnetic film the same as in the first embodiment and is cured to form magnetic layer (174E) (FIG. 13(B)). Then, using a laser, first penetrating hole (174Ea) reaching inductor pattern (158G) is formed in magnetic layer (174E) (FIG. 13(C)). Film for interlayer resin layers and copper foil 152 are laminated on magnetic layer (174E), first penetrating hole 174 is filled with resin (150EE) that has seeped out from the film for interlayer resin layers and is cured so that resin layer (150E) is formed (FIG. 13(D)). Using a laser, second penetrating hole (150Ea) reaching inductor pattern (158G) is formed in resin layer (150E) and in resin (150EE), which is filled in first penetrating hole (174Ea) (FIG. 13(E)). Above-described roughening organic particles in the resin layer are dissolved by a chemical solution so that the inner surface of second penetrating hole (150Ea) is roughened (not shown in the drawings).

Figure 14:
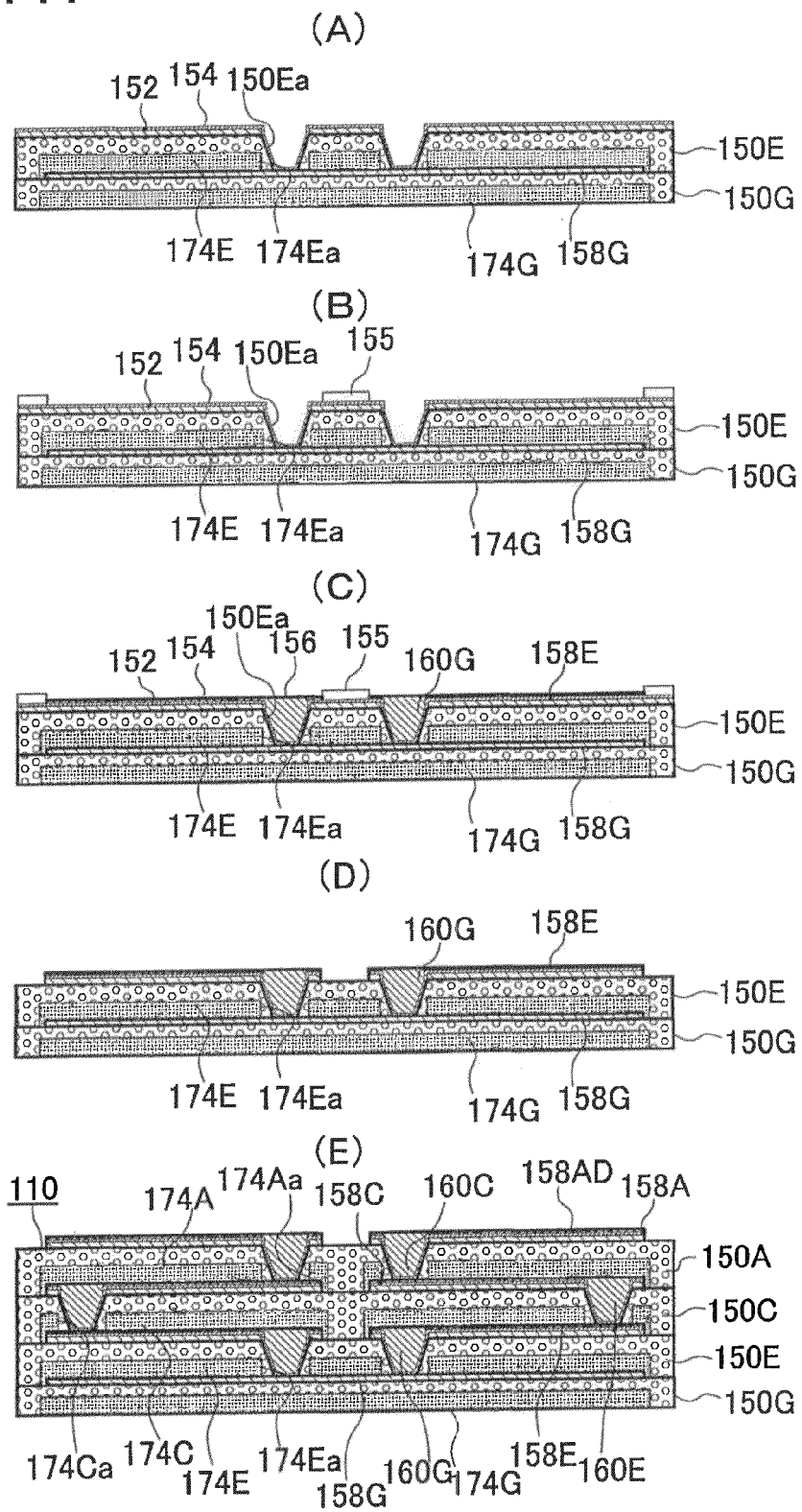
FIGS. 14(A)-14(E) are views showing steps of a method for manufacturing an inductor component of the second embodiment.
Figure 15:
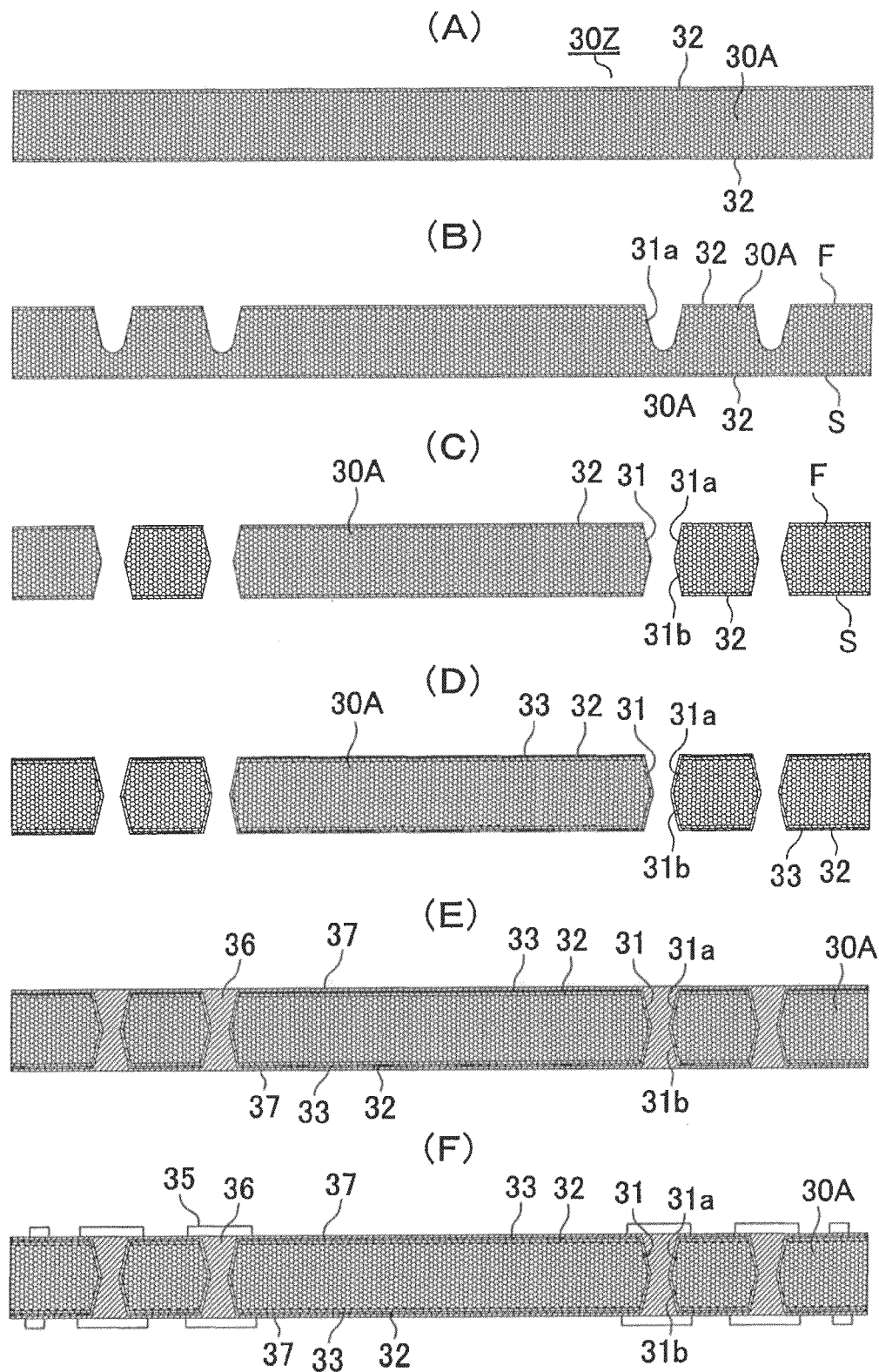
FIGS. 15(A)-15(F) are views showing steps of a method for manufacturing a printed wiring board of the first embodiment.
Figure 16:
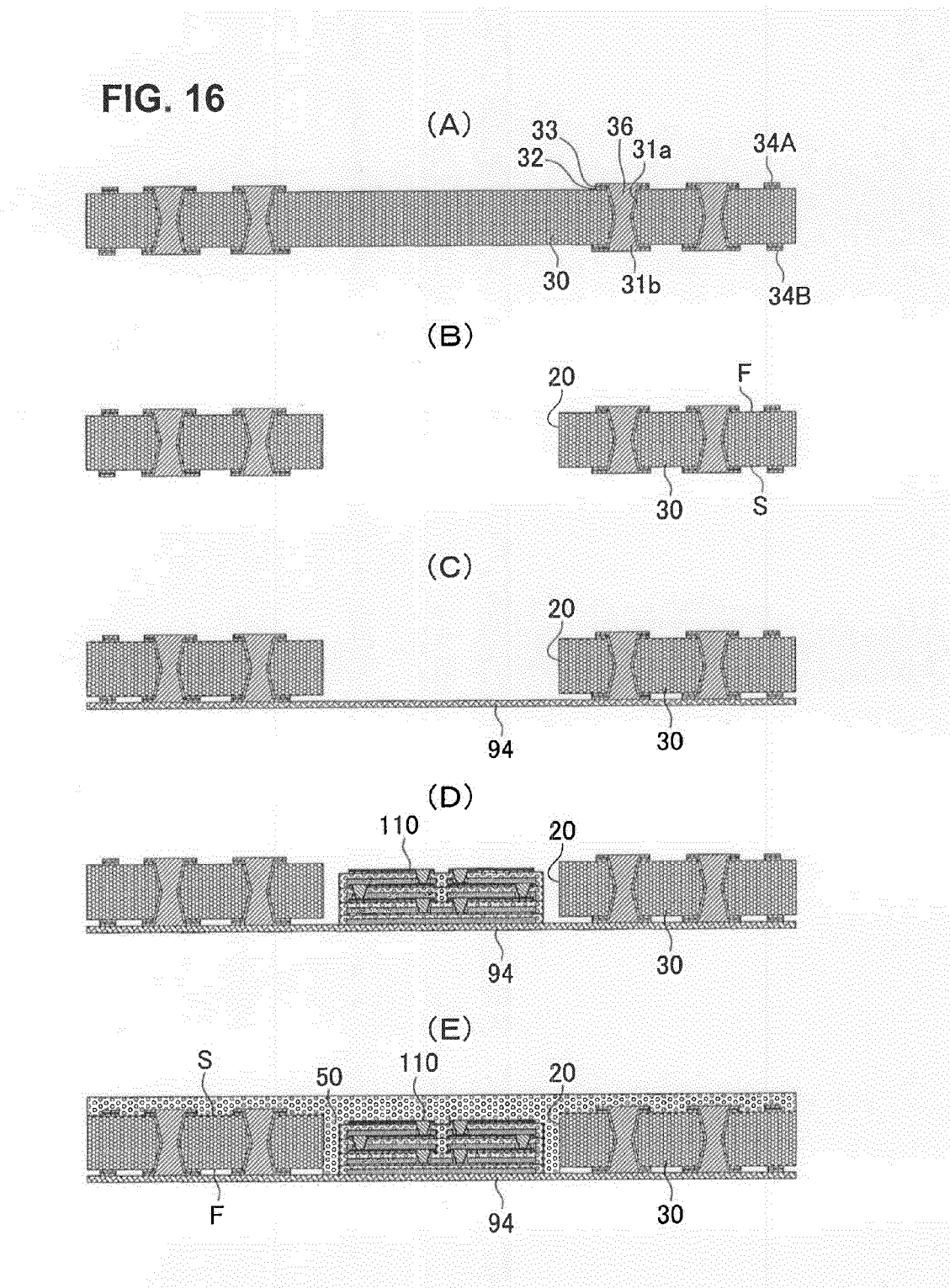
FIGS. 16(A)-16(E) are views showing steps of a method for manufacturing a printed wiring board of the first embodiment.
Figure 17:
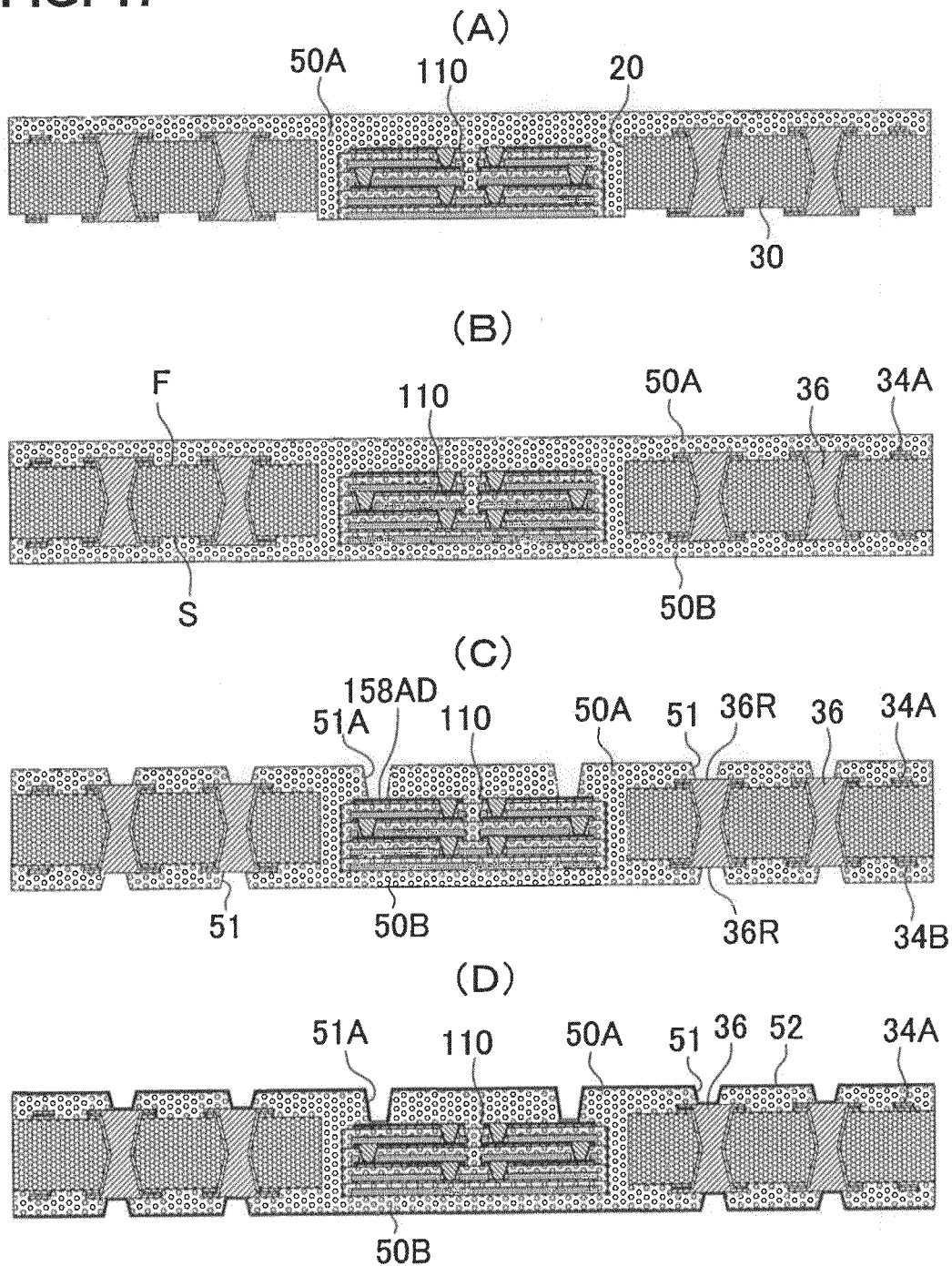
FIGS. 17(A)-17(D) are views showing steps of a method for manufacturing a printed wiring board of the first embodiment.
Figure 18:
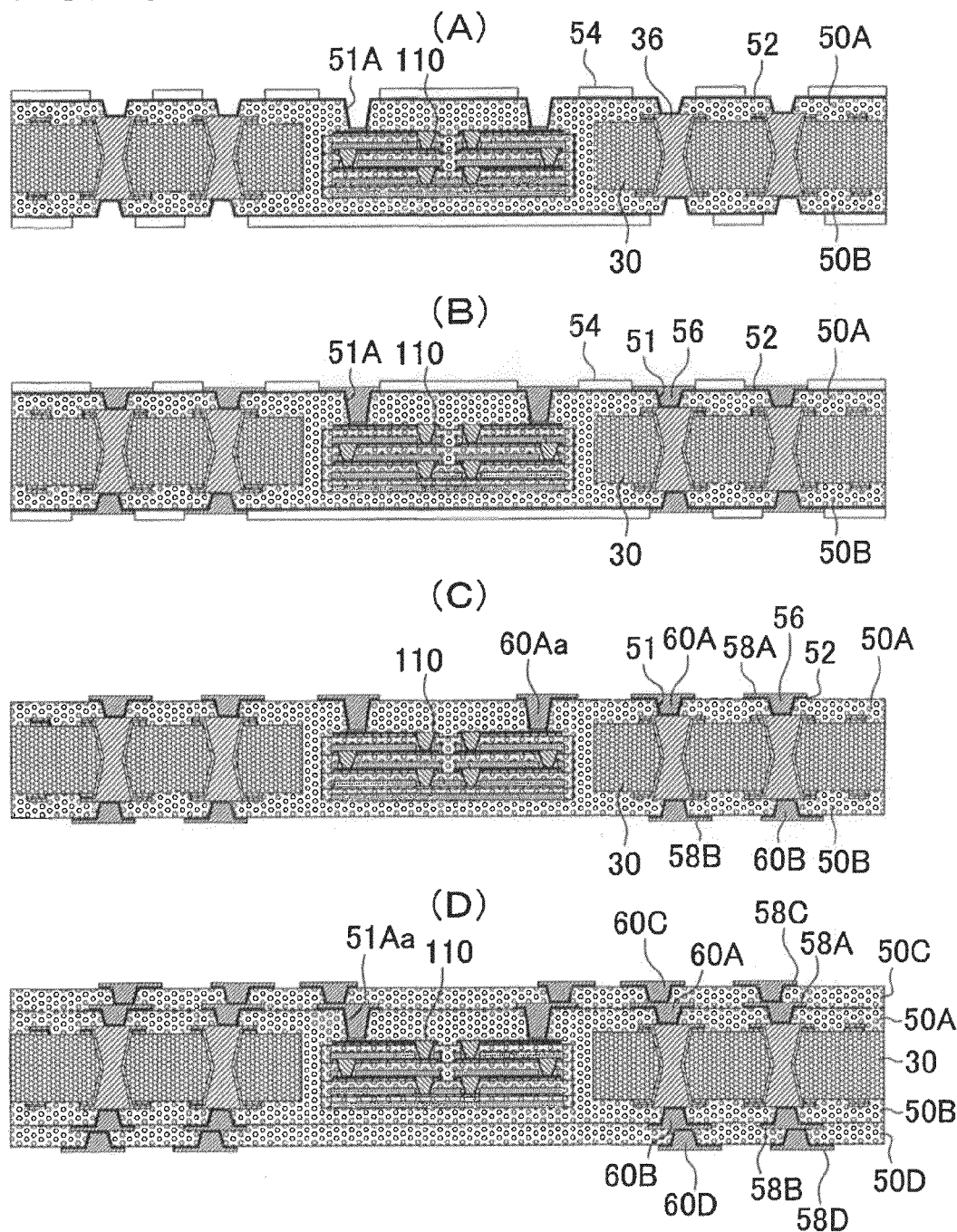
FIGS. 18(A)-18(D) are views showing steps of a method for manufacturing a printed wiring board of the first embodiment.
Figure 19:
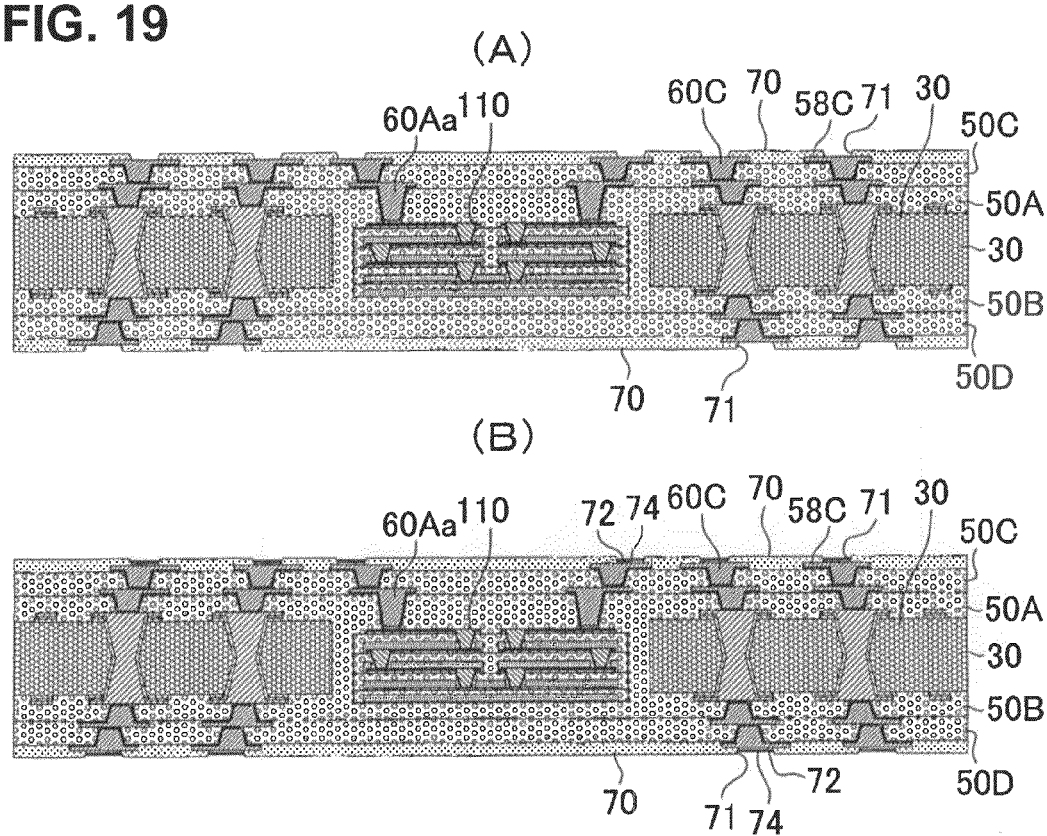
FIGS. 19(A)-19(B) are views showing steps of a method for manufacturing a printed wiring board of the first embodiment.

Electroless plated film 154 is formed on copper foil 152 and in second penetrating hole (150Ea) (FIG. 14(A)). Plating resist 155 with a predetermined pattern is formed on the electroless plated film (FIG. 14(B)). Electrolytic plating is performed to form electrolytic plated film 156 on electroless plated film 154 exposed from the plating resist (FIG. 14(C)). Then, plating resist is removed, and the electroless plated film and copper foil are removed from among portions of electrolytic plated film 156. Inductor pattern (158E) and via conductor (160G) are formed, being made of copper foil 152, electroless plated film 154 and electrolytic plated film 156 (FIG. 14(D)). The treatments shown in FIGS. 13(C)~14(D) are repeated to form resin layer (150C) having via conductor (160E) and inductor pattern (158C), and resin layer (150A)

having via conductor (160C) and inductor pattern (158A). Inductor component 110 is completed (FIG. 14(E)).

Third Embodiment

Figure 21:
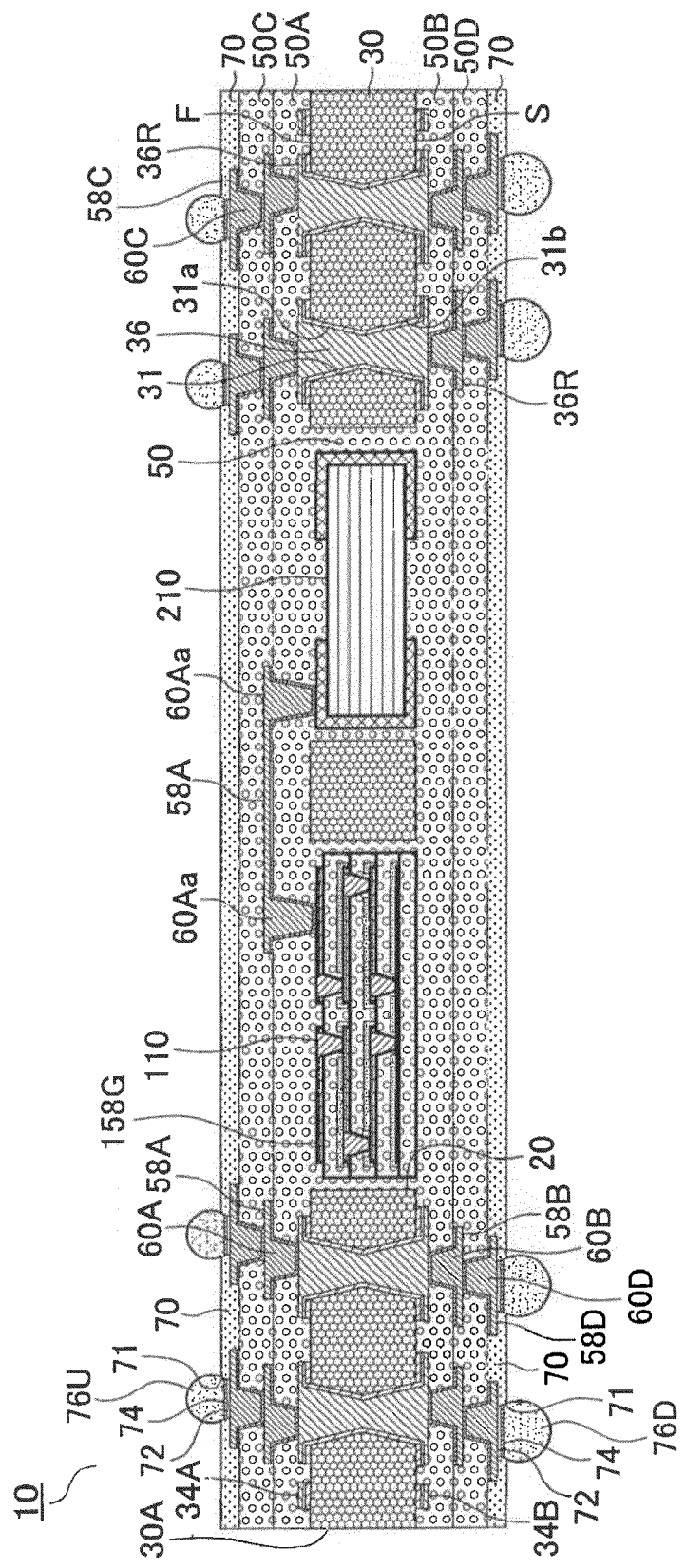
FIG. 21 is a cross-sectional view of a printed wiring board according to a third embodiment.

FIG. 21 is a cross-sectional view of printed wiring board 10 according to a third embodiment. In the third embodiment, chip capacitor 210 is provided in hole 20 of the core substrate along with inductor component 100. Chip capacitor 210 is connected to inductor component 100 (electrodes of the inductor component) by via conductor (60Aa), conductive circuit (58A) and via conductor (60Aa). In this case, a filter including an inductor and a capacitor can be formed near an IC chip. As a result, it is thought to be easy to provide stable electrical voltage for the IC chip.

Modified Example of Third Embodiment

Figure 22:
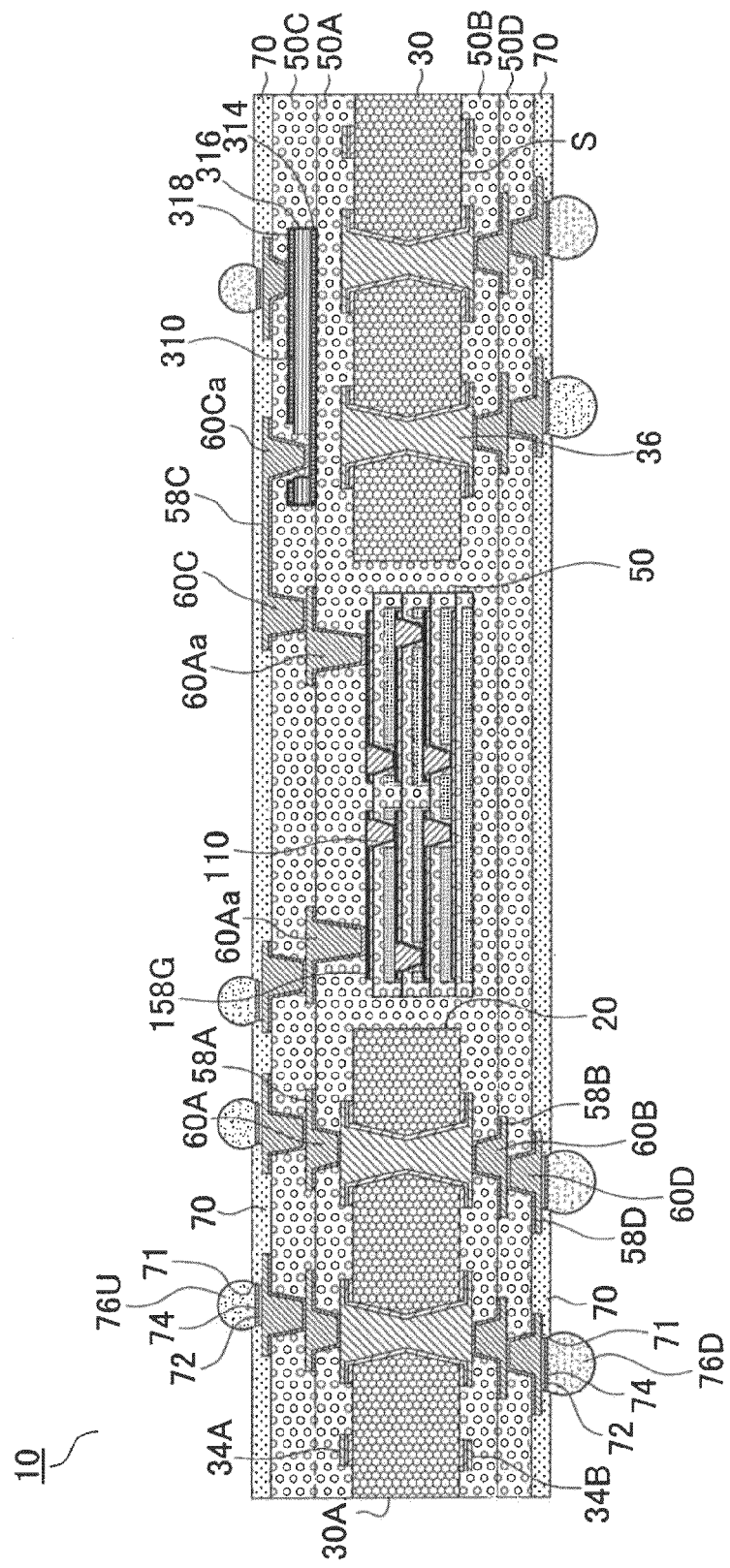
FIG. 22 is a cross-sectional view of a printed wiring board according to a modified example of the third embodiment.

FIG. 22 is a cross-sectional view of printed wiring board 10 according to a modified example of the third embodiment. In a modified example of the third embodiment, thin-film capacitor 310 instead of a chip capacitor is formed on interlayer insulation layer (50A) of the first buildup layer. Thin-film capacitor 310 is formed with lower electrode 314, dielectric layer 316 on lower electrode 314, and upper electrode 318 on dielectric layer 316. Electrode 314 of thin-film capacitor 310 is connected to inductor component 100 (electrode of inductor component). In this case as well, the same effects are achieved as in the above-described third embodiment.

Here, if peripheral portion (174Eaa) of opening (174Ea) in magnetic layer (174E) is set to touch via conductor (160G) as shown in FIG. 23(A), such a structure is also included in an embodiment of the present invention as long as the effects are achieved.

Also, as shown in FIG. 23(B), when forming second resin layer (150EE) filled in opening (174Ea) of magnetic layer (174E), it is an option to use a different material from the material for first resin layer (150E) (150C, 150A). In such a case, to enhance the connection reliability of via conductors, the thermal expansion coefficient of second resin layer (150EE) is preferred to be set lower than that of the first resin layer.

A printed wiring board according to an embodiment of the present invention has the following: a core base having a first surface and a second surface opposite the first surface, and having an opening section that opens at least on the first surface; an inductor component accommodated in the opening section; and filler resin filled in a gap between the inductor component and a side wall of the opening section of the core base. Technical features of such a printed wiring board are the following: the inductor component has a support layer, a first conductive pattern formed on the support layer, an interlayer insulation layer formed on the support layer and on the first conductive pattern, a second conductive pattern formed on the interlayer insulation layer, and a via conductor formed in the interlayer insulation layer and connecting the first conductive pattern and the second conductive pattern; the interlayer insulation layer has a magnetic layer containing magnetic material and resin and having a first penetrating hole, a first resin layer formed on the magnetic layer, and a second resin layer filled in the first penetrating hole; the interlayer insulation layer has a penetrating hole that penetrates through the first resin layer and the second resin layer and reaches the first conductive pattern; and the via conductor is formed in the penetrating hole.

In a printed wiring board according to an embodiment of the present invention, an inductor component having interlayer insulation layers containing magnetic material is accommodated in an opening section of a core material. Accordingly, the magnetic permeability increases, and it is easier to achieve required inductance even when the number of turns of the inductor is reduced. Moreover, via conductors for connecting conductive patterns to each other touch the resin layers without making contact with the magnetic material. Therefore, adhesiveness of via conductors to interlayer insulation layers is enhanced, securing excellent connection reliability.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core base having an opening portion;
an inductor component accommodated in the opening portion of the core base; and
a filler resin filling a gap formed between the inductor component and a side wall of the opening portion of the core base,
wherein the inductor component has a support layer, a first conductive pattern formed on the support layer, an interlayer insulation layer formed on the support layer and the first conductive pattern, a second conductive pattern formed on the interlayer insulation layer, and a via conductor formed in the interlayer insulation layer and connecting the first conductive pattern and the second conductive pattern, the interlayer insulation layer of the inductor component includes a magnetic layer and a resin layer covering the magnetic layer, the magnetic layer of the interlayer insulation layer in the inductor component includes a magnetic material and a resin material and has a first penetrating hole, the interlayer insulation layer has a second penetrating hole penetrating through the resin layer such that the second penetrating hole passes through the first penetrating hole and extends to the first conductive pattern, and the via conductor is formed in the second penetrating hole.

2. The printed wiring board according to claim 1, wherein the resin layer of the interlayer insulation layer has a first resin portion formed on the magnetic layer and a second resin portion filling the first penetrating hole, and the second penetrating hole of the interlayer insulation layer penetrates through the first resin portion of the resin layer and the second resin portion of the resin layer.

3. The printed wiring board according to claim 1, wherein the resin layer of the interlayer insulation layer has a first resin portion formed on the magnetic layer and a second resin portion filling the first penetrating hole, and the second penetrating hole of the interlayer insulation layer penetrates through the first resin portion of the resin layer and the second resin portion of the resin layer such that the via conductor is not in contact with the magnetic layer.

4. The printed wiring board according to claim 1, wherein the resin layer of the interlayer insulation layer has a first resin portion formed on the magnetic layer and a second resin portion filling the first penetrating hole such that the first resin portion and the second resin portion are integrally comprised of a same resin material.

5. The printed wiring board according to claim 1, wherein the resin layer of the interlayer insulation layer has a first resin portion formed on the magnetic layer and a second resin portion filling the first penetrating hole, and the magnetic layer has a thickness which is set greater than a thickness of the first resin portion.

6. The printed wiring board according to claim 1, wherein the second conductive pattern of the inductor component has a metal foil formed on the interlayer insulation layer and a plated layer formed on the metal foil.

7. The printed wiring board according to claim 1, wherein the inductor component has a plurality of interlayer insulation layers and a plurality of conductive patterns formed on the plurality of interlayer insulation layers, respectively, the plurality of interlayer insulation layers includes the interlayer insulation layer formed on the support layer, the plurality of conductive patterns includes the second conductive pattern and an uppermost conductive pattern, and the inductor component has an electrode positioned on one end of the uppermost conductive pattern and is accommodated in the opening portion of the core base such that the electrode faces a surface of the core base.

8. The printed wiring board according to claim 1, wherein the interlayer insulation layer is formed in a plurality, the inductor component has a plurality of conductive patterns formed on the plurality of interlayer insulation layers, respectively, the plurality of conductive patterns includes the second conductive pattern and an uppermost conductive pattern, and the inductor component has an electrode positioned on one end of the uppermost conductive pattern and is accommodated in the opening portion of the core base such that the electrode faces a surface of the core base.

9. The printed wiring board according to claim 1, wherein the inductor component has a plurality of interlayer insulation layers and a plurality of conductive patterns formed on the plurality of interlayer insulation layers, respectively, the plurality of interlayer insulation layers includes the interlayer insulation layer formed on the support layer, the plurality of conductive patterns includes the second conductive pattern and an uppermost conductive pattern, the uppermost conductive pattern has an upper layer, and the inductor component has an electrode formed on the upper layer of the uppermost conductive pattern and is accommodated in the opening portion such that the electrode faces a surface of the core base.

10. The printed wiring board according to claim 1, wherein the support layer has a same structure as the interlayer insulation layer.

11. The printed wiring board according to claim 6, further comprising a chip capacitor having an electrode electrically connected to an electrode of the inductor component, wherein the core base has a second opening portion, and the chip capacitor is accommodated in the second opening portion of the core base.

12. The printed wiring board according to claim 7, further comprising a chip capacitor having an electrode electrically connected to an electrode of the inductor component, wherein the core base has a second opening portion, and the chip capacitor is accommodated in the second opening portion of the core base.

13. The printed wiring board according to claim 1, wherein the core base has a thickness which is set in a range of 200 μm or less.

14. The printed wiring board according to claim 1, wherein the interlayer insulation layer is formed in a plurality, the inductor component has a plurality of conductive patterns formed on the plurality of interlayer insulation layers, respectively, the plurality of conductive patterns includes the second conductive pattern, the plurality of interlayer insulation layers includes a first outermost interlayer insulation layer in contact with a first surface of the core base and a second outermost interlayer insulation layer in contact with a second surface of the core base, the first outermost interlayer insulation layer includes a reinforcing fiber material, and the second outermost interlayer insulation layer includes a reinforcing fiber material.

15. The printed wiring board according to claim 1, wherein the magnetic material of the magnetic layer in the interlayer insulation layer is a plurality of magnetic particles.

16. An inductor component, comprising:
    a support layer;
    a first conductive pattern formed on the support layer;
    an interlayer insulation layer formed on the support layer and the first conductive pattern;
    a second conductive pattern formed on the interlayer insulation layer; and
    a via conductor formed in the interlayer insulation layer and connecting the first conductive pattern and the second conductive pattern,
    wherein the interlayer insulation layer includes a magnetic layer and a resin layer covering the magnetic layer, the magnetic layer of the interlayer insulation layer includes a magnetic material and a resin material and has a first penetrating hole, the interlayer insulation layer has a second penetrating hole penetrating through the resin layer such that the second penetrating hole passes through the first penetrating hole and extends to the first conductive pattern, and the via conductor is formed in the second penetrating hole such that the via conductor is not in contact with the magnetic layer of the interlayer insulation layer.

17. The inductor component according to claim 15, wherein the magnetic material of the magnetic layer in the interlayer insulation layer is a plurality of magnetic particles.

18. The inductor component according to claim 15, wherein the magnetic material of the magnetic layer in the interlayer insulation layer is a plurality of magnetic particles, the interlayer insulation layer is formed in a plurality, the inductor component has a plurality of conductive patterns formed on the plurality of interlayer insulation layers, respectively, the plurality of conductive patterns includes the second conductive pattern and an uppermost conductive pattern, and the inductor component has an electrode positioned on one end of the uppermost conductive pattern.

19. A method for manufacturing an inductor component, comprising:
    forming a support layer on a support substrate;
    forming a first conductive pattern on the support layer;
    forming on the support layer and the first conductive pattern a magnetic layer comprising a magnetic material and a resin material and having a first penetrating hole penetrating through the magnetic layer such that the first penetrating hole extends to the first conductive pattern;
    forming a resin layer on the magnetic layer such that the resin layer covers the magnetic layer, that the resin layer fills the first penetrating hole formed in the magnetic layer and that an interlayer insulation layer comprising the magnetic layer and the resin layer is formed on the support layer;
    forming a second penetrating hole penetrating through the resin layer such that the second penetrating hole passes through the first penetrating hole in the magnetic layer and extends to the first conductive pattern;
    forming a second conductive pattern on the resin layer of the interlayer insulation layer;
    forming a via conductor in the second penetrating hole such that the via conductor connects the first conductive pattern and the second conductive pattern and that the via conductor is not in contact with the magnetic layer of the interlayer insulation layer; and removing the support substrate from the support layer.

20. The method for manufacturing an inductor component according to claim 19, wherein the magnetic material of the magnetic layer is a plurality of magnetic particles dispersed in the resin material.

* * * * *